(12) United States Patent
Tsubata et al.

(10) Patent No.: US 8,304,769 B2
(45) Date of Patent: Nov. 6, 2012

(54) ACTIVE MATRIX SUBSTRATE HAVING CHANNEL PROTECTION FILM COVERING TRANSISTOR CHANNEL, AND DISPLAY APPARATUS AND/OR, TELEVISION RECEIVER INCLUDING SAME

(75) Inventors: Toshihide Tsubata, Tsu (JP); Masanori Takeuchi, Tsu (JP)

(73) Assignee: Sharp Kabushiki Kaisha, Osaka (JP)

( * ) Notice: Subject to any disclaimer, the term of this patent is extended or adjusted under 35 U.S.C. 154(b) by 157 days.

(21) Appl. No.: 12/224,679

(22) PCT Filed: Dec. 5, 2006

(86) PCT No.: PCT/JP2006/324267
§ 371 (c)(1),
(2), (4) Date: Sep. 3, 2008

(87) PCT Pub. No.: WO2007/108181
PCT Pub. Date: Sep. 27, 2007

(65) Prior Publication Data
US 2009/0065778 A1      Mar. 12, 2009

(30) Foreign Application Priority Data

Mar. 15, 2006   (JP) .................................. 2006-071869
Jul. 21, 2006   (JP) .................................. 2006-199835

(51) Int. Cl.
*H01L 29/04* (2006.01)
(52) U.S. Cl. ................ 257/59; 349/38; 257/71; 257/72; 257/E27.111; 257/E27.113; 257/29
(58) Field of Classification Search ........... 349/38; 257/71, 72, E27.111, E27.113, E29.151, 257/59
See application file for complete search history.

(56) References Cited

U.S. PATENT DOCUMENTS

| 5,380,555 A | 1/1995 | Mine et al. |
| 5,517,342 A | 5/1996 | Kim et al. |

(Continued)

FOREIGN PATENT DOCUMENTS

CN   1183570 A   6/1998
(Continued)

OTHER PUBLICATIONS

International Search Report for PCT/JP2006/324267 mailed Feb. 13, 2007.

(Continued)

*Primary Examiner* — David Vu
*Assistant Examiner* — Caleb Henry
(74) *Attorney, Agent, or Firm* — Nixon & Vanderhye P.C.

(57) ABSTRACT

An active matrix substrate of the present invention is arranged so that each pixel area has a transistor and a capacity electrode which is able to function as an electrode of a capacity. The active matrix substrate includes a conductor which is provided in a layer below the capacity electrode and is able to function as the other electrode of the capacity. The gate electrode of each transistor and a gate insulating film covering the conductor have a thin section with reduced thickness, in an on-conductor area overlapping the conductor. At least a part of the thin section overlaps the capacity electrode. In this way, the active matrix substrate which can reduce inconsistency in capacitance values of capacities (e.g. a storage capacitor, a capacity for controlling an electric potential of a pixel electrode, and a capacity which can function as both of them) provided in the substrate.

15 Claims, 30 Drawing Sheets

U.S. PATENT DOCUMENTS

| | | | |
|---|---|---|---|
| 5,576,863 A | 11/1996 | Aoki et al. | |
| 5,757,444 A | 5/1998 | Takemura | |
| 5,767,926 A | 6/1998 | Kim et al. | |
| 5,777,700 A | 7/1998 | Kaneko et al. | |
| 5,818,407 A | 10/1998 | Hori et al. | |
| 5,852,488 A | 12/1998 | Takemura | |
| 5,920,082 A | 7/1999 | Kitazawa et al. | |
| 5,995,175 A | 11/1999 | Kim et al. | |
| 6,057,896 A | 5/2000 | Rho et al. | |
| 6,078,367 A | 6/2000 | Satou | |
| 6,243,146 B1 | 6/2001 | Rho et al. | |
| 6,271,543 B1 | 8/2001 | Ohtani et al. | |
| 6,337,731 B1 | 1/2002 | Takemura | |
| 6,356,318 B1* | 3/2002 | Kawahata | 349/38 |
| 6,576,926 B1 | 6/2003 | Yamazaki et al. | |
| 6,693,681 B1 | 2/2004 | Takemura | |
| 6,940,566 B1 | 9/2005 | Rho et al. | |
| 7,112,844 B2* | 9/2006 | Nagao et al. | 257/344 |
| 7,206,033 B2* | 4/2007 | Yoo et al. | 349/38 |
| 7,554,616 B1 | 6/2009 | Takemura | |
| 7,602,452 B2* | 10/2009 | Kato et al. | 349/38 |
| 2001/0008434 A1* | 7/2001 | Battersby et al. | 349/38 |
| 2001/0010567 A1 | 8/2001 | Rho et al. | |
| 2002/0014624 A1 | 2/2002 | Yamazaki et al. | |
| 2002/0047950 A1 | 4/2002 | Fujikawa et al. | |
| 2002/0057396 A1 | 5/2002 | Tsubo | |
| 2002/0058362 A1 | 5/2002 | Ohtani et al. | |
| 2002/0180903 A1 | 12/2002 | Fujikawa et al. | |
| 2003/0057450 A1 | 3/2003 | Arao | |
| 2003/0179325 A1 | 9/2003 | Rho et al. | |
| 2003/0197178 A1 | 10/2003 | Yamazaki et al. | |
| 2003/0197179 A1 | 10/2003 | Yamazaki et al. | |
| 2004/0001167 A1 | 1/2004 | Takeuchi et al. | |
| 2004/0125248 A1 | 7/2004 | Song | |
| 2004/0169991 A1* | 9/2004 | Nagata et al. | 361/301.1 |
| 2004/0232421 A1* | 11/2004 | Ono et al. | 257/59 |
| 2005/0040401 A1 | 2/2005 | Yamazaki et al. | |
| 2005/0112790 A1* | 5/2005 | Lan et al. | 438/30 |
| 2005/0167669 A1 | 8/2005 | Kim et al. | |
| 2005/0180232 A1 | 8/2005 | Arao | |
| 2005/0184944 A1 | 8/2005 | Miyata et al. | |
| 2005/0185109 A1 | 8/2005 | Rho et al. | |
| 2005/0264741 A1 | 12/2005 | Kim | |
| 2006/0097972 A1 | 5/2006 | Takeuchi et al. | |
| 2006/0103800 A1* | 5/2006 | Li et al. | 349/129 |
| 2007/0196964 A1 | 8/2007 | Kim et al. | |
| 2007/0200113 A1 | 8/2007 | Yamazaki et al. | |
| 2009/0014724 A1 | 1/2009 | Yamazaki et al. | |

FOREIGN PATENT DOCUMENTS

| | | |
|---|---|---|
| CN | 1627517 A | 6/2005 |
| GB | 2 431 504 | 4/2007 |
| JP | 64-18756 | 1/1989 |
| JP | 2-248927 A | 10/1990 |
| JP | 5-307194 A | 11/1993 |
| JP | 6-148681 A | 5/1994 |
| JP | 6-160902 | 6/1994 |
| JP | 6-337436 | 12/1994 |
| JP | 07-191348 | 7/1995 |
| JP | 7-287252 | 10/1995 |
| JP | 08-160452 | 6/1996 |
| JP | 9-105952 | 4/1997 |
| JP | 10-048664 | 2/1998 |
| JP | 10-048668 | 2/1998 |
| JP | 10-102003 | 4/1998 |
| JP | 10-268349 | 10/1998 |
| JP | 10-293323 A | 11/1998 |
| JP | 10-339884 A | 12/1998 |
| JP | 11-015022 A | 1/1999 |
| JP | 11-249171 | 9/1999 |
| JP | 11-340462 | 12/1999 |
| JP | 2000-312007 A | 11/2000 |
| JP | 2001-098224 | 4/2001 |
| JP | 2002-148656 | 5/2002 |
| JP | 2003-098549 | 4/2003 |
| JP | 2004-6837 A | 1/2004 |
| JP | 2005-234552 A | 9/2005 |
| KR | 10-0218584 B1 | 9/1999 |

OTHER PUBLICATIONS

Choi et al., "Performance of TFT passivated with low-K dielectrics", *IDW '03*, pp. 617-620.

EP Search Report mailed Apr. 15, 2009 in corresponding EP application 06834022.3.

Japanese Office Action mailed Jul. 10, 2012 from JP Application No. 2008-144784.

* cited by examiner

ACTIVE MATRIX SUBSTRATE HAVING CHANNEL PROTECTION FILM COVERING TRANSISTOR CHANNEL, AND DISPLAY APPARATUS AND/OR, TELEVISION RECEIVER INCLUDING SAME

This application is the U.S. national phase of International Application No. PCT/JP2006/324267 filed 5 Dec. 2006 which designated the U.S. and claims priority to Japanese Patent Application Nos. 2006-71869 filed 15 Mar. 2006 and JP 2006-199835 filed 21 Jul. 2006, the entire contents of each of which are hereby incorporated by reference.

TECHNICAL FIELD

The present invention relates to an active matrix substrate which is used for a display apparatus such as a liquid crystal display apparatus.

BACKGROUND ART

FIG. 30 (see Patent Document 1) is a plan view of a conventional active matrix substrate. As shown in the figure, in each pixel area 750, its pixel electrode 751 is surrounded by a scanning signal line 752 for supplying a scanning signal- and a data signal line 753 for supplying a data signal, in such a manner that these signal lines intersect with one another. At the intersection of the scanning signal line 752 and the data signal line 753, a TFT (Thin Film Transistor) 754 is provided. The gate electrode 755 of the TFT 754 is connected to the scanning signal line 752, so that the TFT 754 is turned on/off in response to the supply of a scanning signal. The source electrode 766 of the TFT 754 is connected to the data signal line 753 and receives a data signal. The drain electrode 777 of the TFT 754 is connected to a drain lead line.

To prevent self-discharge of a liquid crystal layer when the TFT is turned off and to prevent the deterioration of an image signal due to an off-current of the TFT, the pixel area 750 is provided with a storage capacity wire 759 having, for example, a circular shape. As shown in FIG. 30, this storage capacity wire 759 is provided to overlap the edges of the pixel electrode 751. The drain electrode 777 of the TFT 754 is connected to the pixel electrode 751, and the pixel electrode 751 and the storage capacity wire 759 form a storage capacitor.

[Patent Document 1] Japanese Unexamined Patent Publication No. 6-301059 (published on Oct. 28, 1994)

[Patent Document 2] Japanese Unexamined Patent Publication No. 7-287252 (published on Oct. 31, 1995)

[Patent Document 3] Japanese Unexamined Patent Publication No. 2004-78157 (published on Mar. 11, 2004)

[Patent Document 4] Japanese Unexamined Patent Publication No. 6-332009 (published on Dec. 2, 1994)

[Patent Document 5] Japanese re-publication of PCT international application No. WO97/00463 (internationally published on Jan. 3, 1997)

DISCLOSURE OF INVENTION

On account of recent upsizing of active matrix substrates, an exposure process is performed in plural steps, in a photolithography process for forming a signal layer. This is because it is difficult to perform exposure of the entirety of a large substrate at one time. Such an exposure process involves problems such as inconsistency in line widths of resist patterns and misalignment, on account of inconsistency in exposure levels between exposure steps. Inconsistency in line widths of resist patterns (e.g. difference between the widths of storage capacity wires and the widths of electrodes each of which forms a capacity with the storage capacity wire) induces inconsistency in the capacitances of the storage capacities, thereby influencing on the display quality. In the arrangement shown in FIG. 30, the display quality deteriorates when the conditions (line width, alignment and the like) of the storage capacity wire 759 and the pixel electrode 751 are inconsistent.

The aforementioned Patent Document 2 discloses, as shown in FIG. 31(a) and FIG. 31(b), an arrangement such that a thin interlayer insulating film 941 and a thick interlayer insulating film 942 form a multilayer structure exclusively at the intersections of source lines 910 and gate lines 909 and parts other than the intersections are provided only with the thin interlayer insulating film 941. Also in this arrangement, one electrode 912 of a charge storage capacitor (the other electrode is a pixel electrode 911) is entirely covered only by the thin interlayer insulating film 941. For this reason inconsistency in the width of the electrode 912 induces a variation in a capacitance value of the charge storage capacitor.

In addition to the above, an arrangement having recently drawing attention is such that areas which are different in brightness (i.e. plural sub pixels) are formed in each pixel by means of external control of an electric potential of a storage capacity wire (see the abovementioned Patent Document 3, for example). In this arrangement, the storage capacitor is used also as a capacity for controlling an electric potential of the pixel electrode. In the meanwhile, the above-mentioned Patent Documents 4 and 5 disclose an arrangement such that capacitor electrodes are provided to face respective pixel electrodes with an insulating layer being interposed therebetween, and voltages are applied to the pixel electrodes at different ratios by means of capacitive coupling of the pixel electrodes. Also in this arrangement, a capacitor is used for controlling an electric potential of each pixel electrode. In these arrangements, the display quality deteriorates as the storage capacitor or a capacitance value of the capacity for controlling an electric potential is inconsistent.

The present invention was achieved in consideration of the problem above, and the objective of the present invention is to provide an active matrix substrate which can reduce inconsistency in capacitance values of capacities (e.g. a storage capacitor, a capacity for controlling an electric potential of a pixel electrode, and a capacity which can function as both of them) provided in the substrate.

The active matrix substrate of the present invention, in which each pixel area has a transistor and a capacity electrode which is connected to the transistor and is able to function as an electrode of a capacity, includes: a conductor which is provided in a layer below the capacity electrode and is able to function as the other electrode of the capacity; and an insulating film which covers the conductor, the insulating film having a thin section with reduced thickness in an on-conductor area where the insulating film overlaps the conductor, at least a part of the thin section overlapping the capacity electrode. Also, the present active matrix substrate includes a transistor, a conductor, an insulating film covering the conductor, and a capacity electrode provided in a layer above the insulating film to form a capacity with the conductor, the capacity electrode being connected to the transistor, the insulating film having reduced thickness at a part of an area where the insulating film overlaps the capacity electrode and the conductor.

The capacity is used as, for example, a storage capacitor, a capacity for controlling an electric potential of a pixel electrode, or a capacity which functions as both of them.

In the arrangement above, a thin section which is thinner than the surrounding is provided in an insulating film provided between the conductor and the capacity electrode. Therefore, being different from the conventional arrangement in which a capacitance value is determined by the entirety of the area where the conductor overlaps the capacity electrode, a capacitance value of the capacity is predominantly determined by the area where the conductor, the capacity electrode, and the thin section overlap one another.

Since the thin section is provided in the on-conductor area of the insulating film, a conductor (e.g. storage capacity wire) has error tolerance with respect to the thin section. For this reason a capacitance value scarcely changes even if the line width of the conductor is inconsistent of misalignment occurs, on condition that no edge of the capacity overlaps the thin section.

In this way, the present active matrix substrate makes it possible to reduce inconsistency in capacitance values of capacities (e.g. a storage capacitor, a capacity for controlling an electric potential of a pixel electrode, and a capacity which can function as both of them) within the substrate, thereby having high display quality. The insulating film may be a gate insulating film covering the gate electrode of the transistor or may be an interlayer insulating film covering a channel part of the transistor.

The present active matrix substrate is preferably adapted so that the thin section is locally formed at a central part of the on-conductor area. This makes it possible to allow the conductor to have higher error tolerance with respect to the thin section.

The present active matrix substrate is preferably adapted so that the entirety of the thin section overlaps the capacity electrode. With this, the capacity electrode has error tolerance with respect to the thin section, and hence a capacitance scarcely changes even if the width of the capacity electrode is inconsistent or misalignment occurs, on condition that no edge of the capacity overlaps the thin section. As a result a display apparatus adopting the present active matrix substrate has further improved display quality.

The present active matrix substrate may be adapted so that the capacity electrode is a pixel electrode connected with a drain electrode of the transistor, or the capacity electrode is a drain lead electrode which is an extension of a drain electrode of the transistor. Also, present active matrix substrate may be adapted so that the conductor is a part of a storage capacity wire, or the conductor is a part of a scanning signal line of an immediately preceding or immediately subsequent stage in a scanning direction.

The present active matrix substrate may be adapted so that, a pixel electrode is formed on the thin section with a first interlayer insulating film being interposed between the pixel electrode and the thin section, the first interlayer insulating film covering a channel part of the transistor.

The present active matrix substrate may be adapted so that the drain lead electrode is formed directly on the thin section or the drain lead electrode is formed on the thin section with a semiconductor layer being interposed therebetween. In this case, a contact hole may be formed on the thin section, and the drain lead electrode may contact a pixel electrode in the contact hole. Also, a first interlayer insulating film covering a channel part of the transistor and a second interlayer insulating film which is thicker than the thin section may be provided on areas other than the contact hole between the pixel electrode and the gate insulating film.

The present active matrix substrate may be adapted so that the gate insulating film is constituted by plural gate insulating layers, and at least one of the gate insulating layers is arranged to be thin in the thin section.

The present active matrix substrate may be adapted so that the gate insulating film is constituted by plural gate insulating layers, at least one gate insulating layer being provided in the thin section, more gate insulating layers being provided in areas other than the thin section. In this case, a gate insulating layer including an organic matter may be provided. Also, at least one of the gate insulating layers may be a flattening film. This reduces a bump at the intersection of the scanning signal line and the data signal line. Since the data signal line is required to bridge a lower height when crossing the scanning signal line, the breaking of the data signal line at the intersection with the data signal line is restrained. Furthermore, when, for example, one of the gate insulating layers is an SiNx (silicon nitride) film, the fineness at the taper section of the gate electrode is lower than the fineness in the other areas (i.e. the quality of the film is low), and hence the breaking of SiNx due to static electricity tends to occur. If one of the gate insulating layers is a flattening film, the thickness of the insulating film is secured at the taper section, and hence the breaking of the SINx film is prevented.

The present active matrix substrate may be adapted so that a gate insulating layer including an organic matter is provided. In this case the thickness of the gate insulating layer including the organic matter is preferably 1.0 [μm] or more and 5.0 [μm] or less Also, the undermost gate insulating layer is preferably a flattening film in the areas other than the thin section. Also, a part of the flattening film, which part contacts a surface of the substrate, is preferably thicker than the gate electrode formed on the surface of the substrate. This makes it possible to enhance the flattening effect and hence the short-circuit between the signal lines is further restrained. Also, the breaking of the data signal line is further restrained.

This undermost gate insulating layer is preferably a flattening film (SOG film) made of a spin on glass (SOG) material. This makes it possible to successively form, on the SOG film as the first gate insulating layer, a second insulating layer, a high-resistance semiconductor layer, and a low-resistance semiconductor layer by CVD or the like. As a result the manufacturing steps are shortened. In this case, it is possible to adopt an alternative arrangement such that the thin section is not provided with a SOG film and an SOG film is formed in the undermost layer of the other areas. In addition to the above, when areas around edges of the thin section of the gate insulating film are arranged to have a forward tapered shape, the electrodes formed in the layers above are not easily broken.

The present active matrix substrate may be adapted so that a first interlayer insulating film is provided on the gate insulating film so as to cover a channel part of the transistor, and the sum of the thickness of the gate insulating film and the thickness of the first interlayer insulating film is 1.65 [μm] or more and 5.65 [μm] or less in the areas other than the thin section.

The present active matrix substrate may be adapted so that the conductor is a circular storage capacity wire formed to overlap an edge of the pixel electrode. Also, The present active matrix substrate may be adapted so that a pixel electrode is provided as the capacity electrode and the pixel electrode has (i) an edge extending along a data signal line connected to a source electrode of the transistor and (ii) an edge facing that edge, and the storage capacity wire is formed to overlap both of these edges.

In the arrangement above, the area where the pixel electrode overlaps the thin section compensates an error of the pixel electrode or the thin film, and hence a capacitance value of the storage capacitor does not easily change. Also, the storage capacity wire is formed so as to overlap, among the edges of the pixel electrode, an edge extending along the data signal line and an edge facing this edge, and the field-shielding effect thereof reduces a parasitic capacity between the pixel electrode and the data signal line.

The present active matrix substrate may be adapted so that a first pixel electrode is provided as the capacity electrode, and a second pixel electrode is provided so as to form a capacity with the conductor, the capacity which is formed by the first pixel electrode and the conductor is connected in series with a capacity formed by the conductor and the second pixel electrode. In this case the drain electrode of the transistor and the conductor may be made of the same material.

To achieve the objective above, the active matrix substrate of the present invention, in which each pixel area has: first and second transistors; a first capacity electrode which is connected to the first transistor and is able to function as an electrode of a first capacity; and a second capacity electrode which is connected to the second transistor and is able to function as an electrode of a second capacity, includes: a first conductor which is provided in a layer below the first capacity electrode and is able to function as the other electrode of the first capacity; and a second conductor which is provided in a layer below the second capacity electrode and is able to function as the other electrode of the second capacity, gate insulating films, covering gate electrodes of the transistors and the conductors, being provided with a first thin section with reduced thickness in a first on-conductor area overlapping the first conductor and with a second thin section with reduced thickness in a second on-conductor area overlapping the second conductor, at least a part of the first thin section overlapping the first capacity electrode, at least a part of the second thin section overlapping the second capacity electrode.

According to the arrangement above, since the first thin section is provided in the first on-conductor area of the gate insulating film, the first conductor (e.g. storage capacity wire) has error tolerance with respect to the first thin section. Therefore a capacitance value of the first capacity scarcely changes even if the line width of the first conductor is inconsistent or misalignment occurs, on condition that no edge of the first capacity overlaps the first thin section. Similarly, since the second thin section is provided in the second-on-conductor area of the gate insulating film, the second conductor (e.g. storage capacity wire) has error tolerance with respect to the second thin section. Therefore a capacitance value of the second capacity scarcely changes even if the line width of the second conductor is inconsistent or misalignment occurs, on condition that no edge of the second capacity overlaps the second thin section.

In this way, the present active matrix substrate makes it possible to restrain capacitance values of the first and second capacities (storage capacitor, capacity for controlling an electric potential of the pixel electrode, and a capacity which functions as both of them) from being inconsistent within the substrate, and hence it is possible to improve the display quality of a display apparatus adopting the present active matrix substrate.

It is noteworthy that the arrangement above is suitable for multi-pixel drive in which electric potentials of the first and second pixel electrodes are actively controlled by using the first and second capacities. When a display apparatus performing the aforesaid multi-pixel drive displays a predetermined halftone, display areas corresponding to respective exposure areas are different in brightness (because, when the active matrix substrate is fabricated, exposure amounts are different among the respective exposure steps and hence the line width of the resist pattern is inconsistent or misalignment occurs, with the result that capacitance values of the capacities formed by the capacity electrodes and the conductors become inconsistent within the substrate). The present arrangement effectively restrains inconsistency in capacitance values of the first and second capacities within the substrate, and hence the problem above is resolved.

The present active matrix substrate may be adapted so that the first thin section is locally formed at a central part of the first on-conductor area, and the second thin section is locally formed at a central part of the second on-conductor area. This makes it possible to increase error tolerance of the first conductor with respect to the first thin section and error tolerance of the second conductor with respect to the second thin section.

The present active matrix substrate may be adapted so that the entirety of the first thin section overlaps the first capacity electrode, and the entirety of the second thin section overlaps the second capacity electrode. As a result of this the first capacity electrode has error tolerance with respect to the first thin section, and hence the first capacity scarcely changes even if the width of the first capacity electrode is inconsistent or misalignment occurs, on condition that no edge of the first capacity overlaps the first thin section. The same holds true for the second capacity electrode and the second thin section. Therefore the display quality of the display apparatus adopting the present active matrix substrate is further improved.

The present active matrix substrate may be adapted so that the first capacity electrode is a first pixel electrode connected to a drain electrode of the first transistor, the second capacity electrode is a second pixel electrode connected to a drain electrode of the second transistor, and the first and second pixel electrodes are formed in each pixel area. Also, the present active matrix substrate may be adapted so that the first capacity electrode is a first drain lead electrode which is an extension of a drain electrode of the first transistor, and the second capacity electrode is a second drain lead electrode which is an extension of a drain electrode of the second transistor.

The present active matrix substrate is preferably adapted so that the first and second conductors are parts of first and second storage capacity wires, respectively, and are able to individually control electric potentials of the first and second storage capacity wires, and electric potentials of the first and second pixel electrodes are individually controlled by this potential control. Also, the present active matrix substrate is preferably adapted so that each pixel area is provided with a first pixel electrode connected to the drain electrode of the first transistor and a second pixel electrode connected to the drain electrode of the second transistor, and the first and second conductors are parts of first and second storage capacity wires, respectively, and are able to individually control electric potentials of the first and second storage capacity wires, and electric potentials of the first and second pixel electrodes are individually controlled by this potential control.

In this way, by individually performing potential control of each storage capacity wire, electric potentials of the first and second pixel electrodes are individually controlled, and hence two areas which are different in brightness are formed in each pixel area (i.e. so-called multi-pixel drive is performed). The arrangement above restrains capacitance values of the first and second capacities (which function as both a storage capacitor and a capacity for controlling an electric potential of the pixel electrode) from being inconsistent within the substrate. Therefore the display quality of a display apparatus performing multi-pixel drive is improved. In this case, a potential of each storage capacity wire may be controlled in such a way that the potential increases or decreases after each transistor is turned off and the increased or decrease state is maintained until the transistor is turned off in a next frame. That is to say, the electric potential of the first storage capacity wire is controlled in such a way that the electric potential increases after each of the transistors is turned off and an increased state continues until each of the transistors is turned off in a next frame, and the electric potential of the second storage capacity wire is controlled in such a way that the electric potential decreases after each of the transistors is turned off and a decreased state continues until each of the transistors is turned off in a next frame, or the electric potential of the first storage capacity wire is controlled in such a way that the electric potential decreases after each of the transistors is turned off and a decreased state continues until each of the transistors is turned off in a next frame, and the electric potential of the second storage capacity wire is controlled in such a way that the electric potential increases after each of the transistors is turned off and an increased state continues until each of the transistors is turned off in a next frame. This arrangement reduces an influence of blunting of the waveform of an electric potential of each storage capacity wire on a drain effective potential, and hence the arrangement is effective for the reduction of brightness inconsistency. In addition, the present active matrix substrate may be adapted so that an increase in the electric potential of the first storage capacity wire occurs one horizontal period before or after a decrease in the electric potential of the second storage capacity wire, or a decrease in the electric potential of the first storage capacity wire occurs one horizontal period before or after an increase in the electric potential of the second storage capacity wire.

The present active matrix substrate may be adapted so that the first and second capacity electrodes are respectively formed on the first and second thin sections, directly or with either a semiconductor layer or a first interlayer insulating film covering a channel part of each of the transistors being interposed therebetween.

The present active matrix substrate may be adapted so that the gate insulating film is constituted by plural gate insulating layers, at least one gate insulating layer is provided in the first and second thin sections, and more gate insulating layers are provided in areas other than the first and second thin sections. Also, the present active matrix substrate may be adapted so that the undermost gate insulating layer is an SOG film made of a spin on glass (SOG) material in the areas other than the first and second thin sections, whereas no SOG film is provided in the first and second thin sections.

The present active matrix substrate may be adapted so that the gate insulating layer has another thin section with reduced thickness in an area overlapping the semiconductor layer of the first and second transistors.

The present active matrix substrate may be adapted so that the insulating film includes an insulating layer made of an SOG (spin on glass) material in areas other than the part with reduced thickness, whereas there is provided no insulating layer made of the SOG material in the part with reduced thickness.

The present active matrix substrate may be adapted so that the insulating film is a gate insulating film covering a gate electrode of the transistor, the conductor is a storage capacity wire, and the capacity electrode is either a pixel electrode connected to a drain electrode of the transistor or a drain lead electrode which is an extension of the drain electrode of the transistor.

A display apparatus of the present invention includes the above-described active matrix substrate.

A television receiver of the present invention includes the above-described display apparatus and a tuner section receiving television broadcast.

In this way, the present active matrix substrate makes it possible to reduce inconsistency in capacitance values of capacities (e.g. a storage capacitor, a capacity for controlling an electric potential of a pixel electrode, and a capacity which can function as both of them) within the substrate, and the display quality of a display apparatus adopting the present active matrix substrate is improved.

REFERENCE NUMERALS

10 PIXEL AREA
11a and 11b CONTACT HOLES
12a FIRST TFT
12b SECOND TFT
15 DATA SIGNAL LINE
16 SCANNING SIGNAL LINE
17a FIRST PIXEL ELECTRODE
17b SECOND PIXEL ELECTRODE
31a FIRST THIN SECTION
31b SECOND THIN SECTION
52a FIRST STORAGE CAPACITY WIRE
52b SECOND STORAGE CAPACITY WIRE
107a FIRST DRAIN LEAD ELECTRODE
107b SECOND DRAIN LEAD ELECTRODE

BEST MODE FOR CARRYING OUT THE INVENTION

Embodiment 1

The following will describe Embodiment 1 of the present invention with reference to FIG. 1 through FIG. 4 and FIG. 9.

Figure 1:
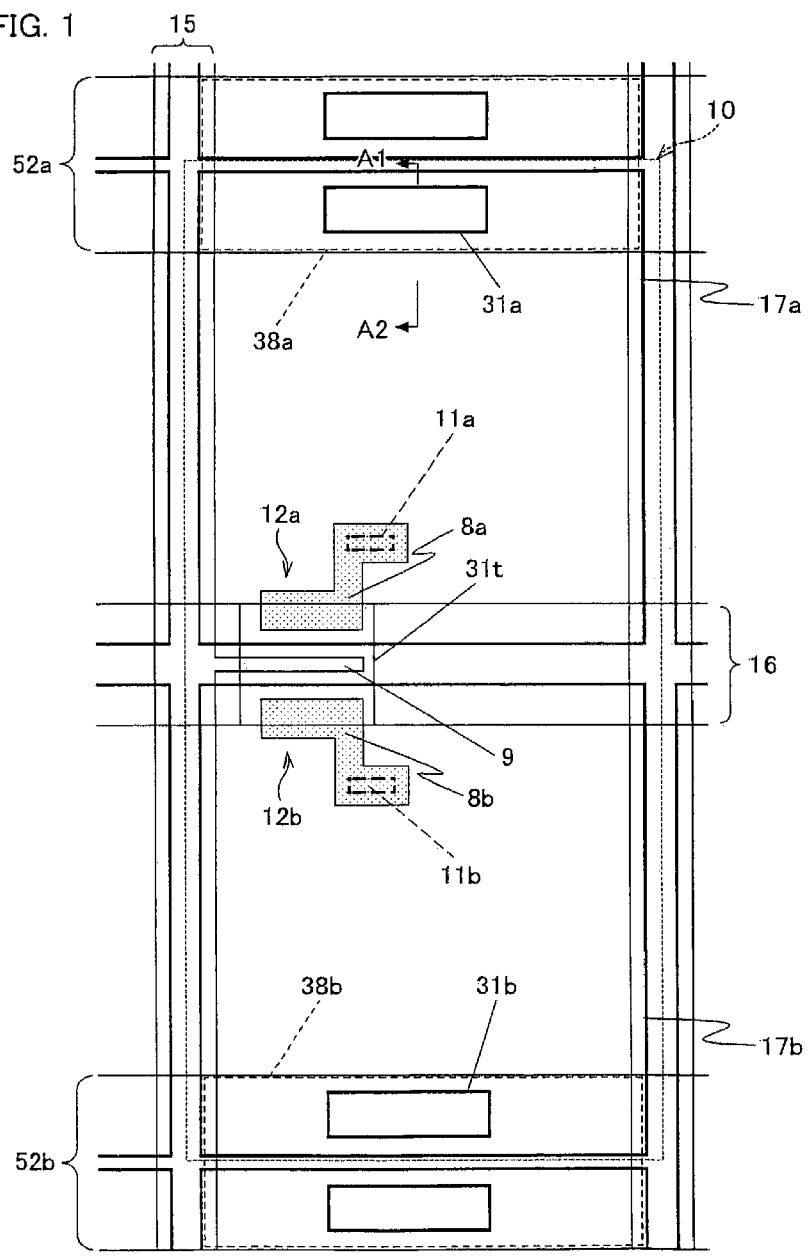
FIG. 1 is a plan view of an active matrix substrate of Embodiment 1.

FIG. 1 is a plan view which outlines an active matrix substrate of the present embodiment. As shown in the figure, the present active matrix substrate is arranged for multi-pixel drive, and each pixel area 10 includes a first TFT (Thin Film Transistor) 12a, a second TFT 12b, a first pixel electrode 17a, a second pixel electrode 17b, a first contact hole 11a, and a second contact hole 11b.

The present active matrix substrate is further provided with a scanning signal line 16 extending in the horizontal direction in the figure and a data signal line 15 extending in the vertical direction in the figure, which are arranged to be perpendicular to one another. Inside the pixel area 10, the first pixel electrode 17a is provided in the upper half, the second pixel electrode 17b is provided in the lower half, and the scanning signal line 16 traverses the central part. This scanning signal line 16 overlaps the first pixel electrode 17a (the lower part of the first pixel electrode 17a in FIG. 1) and the second pixel electrode 17b (the upper part of the second pixel electrode 17b in FIG. 1). The data signal line 15 is formed to overlap the left edges of the first and second pixel electrodes (17a and 17b). Around the intersection of the data signal line 15 and the scanning signal line 16, the first and second TFTs 12a and 12b are formed.

The first TFT 12a includes a source electrode 9 and a first drain electrode 8a, and its gate electrode is a part of the scanning signal line 16. The first TFT 12b includes the source electrode 9 and a second drain electrode 8b, and its gate electrode is a part of the scanning signal line 16. In this way the first and second TFTs 12a and 12b share the source electrode and the gate electrode. The source electrode 9 is connected to the data signal line 15, and the first drain electrode 8a is connected to the pixel electrode 17a through the contact hole 11a. The second drain electrode 8b is connected to the second pixel electrode 17b through the contact hole 11b. The first and second pixel electrodes 17a and 17b are transparent electrodes made of ITO or the like, and allow light (backlight beam) coming from below the present active matrix substrate to pass through.

The present active matrix substrate includes first and second storage capacity wires 52a and 52b formed on a surface of a substrate so as to extend in the horizontal direction in the figure. The first storage capacity wire 52a overlaps the first pixel electrode 17a (the upper part of the first pixel electrode 17a in FIG. 1), whereas the second storage capacity wire 52b overlaps the first pixel electrode 17b (the lower part of the second pixel electrode 17b in FIG. 1).

The first pixel electrode 17a functions as an electrode of a capacity C1, whereas the first storage capacity wire 52a functions as the other electrode of the capacity C1. Similarly, the second pixel electrode 17b functions as an electrode of a capacity C2, whereas the second storage capacity wire 52b functions as the other electrode of the capacity C2. These capacities C1 and C2 each function as both a storage capacitor and a capacity for controlling an electric potential of the pixel electrode.

That is to say, in the present active matrix substrate, data (signal potential) on the data signal line 15 is supplied to the first and second pixel electrodes 17a and 17b, through the common source electrode 9 of the TFTs (12a and 12b) and the first and second drain electrodes 8a and 8b. The first and second storage capacity wires 52a and 52b receive signal voltages with inverse polarities, and the first and second pixel electrodes 17a and 17b are controlled so as to have different electric potentials (details will be given later). As a result of this, a bright area and a dark area are formed within each pixel 10, so that a halftone is represented by area coverage modulation. As a result the display quality is improved because, for example, whitish appearance at oblique viewing angles is restrained. It is noted that the storage capacitor is an auxiliary capacity which keeps an electric potential written into each of the pixel electrodes (17a and 17b) until the next data signal is input to each of the pixel electrodes (17a and 17b).

The active matrix substrate is provided with a gate insulating film which covers the scanning signal line (the gate electrode of each transistor) and the storage capacity wire. This gate insulating film therefore has a first on-conductor area 38a overlapping the first storage capacity wire 52a and a second on-conductor area 38b overlapping the second storage capacity wire 52b.

In the present embodiment, a first thin section 31a whose film thickness is thinner than that of the surrounding areas is formed in the first on-conductor area 38a of the gate insulating film. The gate insulating film has plural gate insulating layers. The first thin section 31a is formed by partially removing or thinning at least one of the gate insulating layers. More specifically, the first thin section 31a has a horizontally-long rectangular shape, and is formed in the area where the first on-conductor area 38a overlaps the first pixel electrode 17a. In short, the entirety of the first thin section 31a overlaps the first pixel electrode. Also, in the second on-conductor area 38b of the gate insulating film, a second thin section 31b with reduced film thickness is formed. The gate insulating film includes the plural gate insulating layers. The second thin section 31b is formed by partially removing or thinning at least one of the gate insulating layers. More specifically, the second thin section 31b has a rectangular shape and is long along the scanning signal line. The second thin section 31b is formed in the area where the second on-conductor area 38b overlaps the second pixel electrode 17b. In other words the entirety of the second thin section 31b overlaps the second pixel electrode 17b.

In the present embodiment, as shown in FIG. 1, the below-channel area of each TFT is provided with a thin section 31t (whose arrangement is identical with the first or second thin section), in order to improve the properties of the first and second TFTs 12a and 12b.

Figure 2:
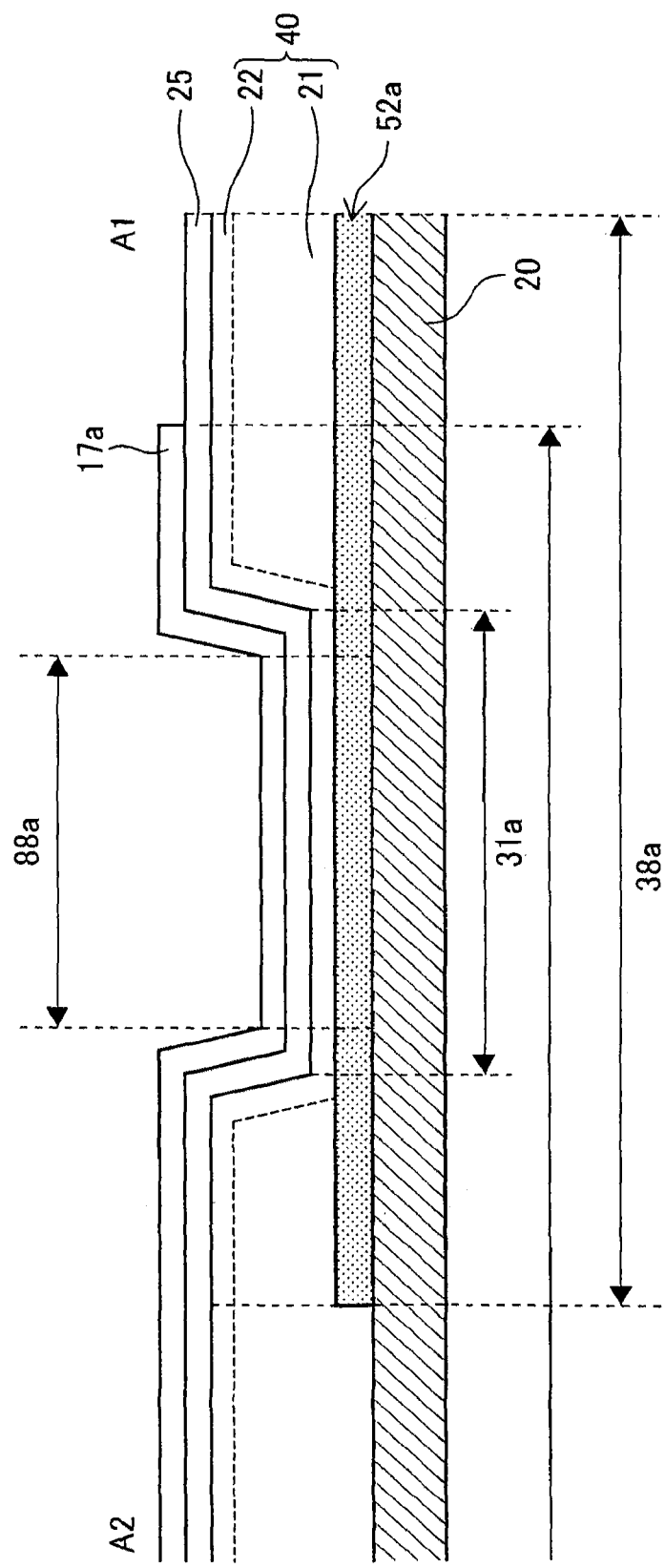
FIG. 2 is a cross section of the active matrix substrate of Embodiment 1.

FIG. 2 is a cross section at A1-A2 line in FIG. 1. As shown in FIGS. 1 and 2, the first storage capacity wire 52a is formed on a glass substrate 20, and the gate insulating film 40 (which covers the scanning signal line 16) covers the first storage capacity wire 52a and a surface of the glass substrate. On this gate insulating film 40, a first interlayer insulating film 25 covering the channel sections of the first and second TFTs 12a and 12b and the first pixel electrode 17a are formed in this order. The gate insulating film includes a first gate insulating layer 21 made of an SOG material and a second gate insulating layer 22 made of SiNx. At a part of the first on-conductor area 38a, the first gate insulating layer 21 is removed and this part is the first thin section 31a. On this first thin section 31a, the first pixel electrode 17a is formed with the first interlayer insulating film 25 being interposed therebetween.

As such, in the gate insulating film, because a part of the area between the first storage capacity wire 52a and the first pixel electrode 17a is formed so as to have reduced thickness (i.e. the first thin section 31a is formed), a capacitance value of the capacity C1 can be dominantly determined by a part 88a where the first storage capacity wire 52a overlaps the first thin section 31a. Similarly, in the gate insulating film, because a part of the area between the second storage capacity wire 52b and the second pixel electrode 17b is formed so as to have reduced thickness (i.e. the second thin section 31b is formed), a capacitance value of the capacity C2 can be dominantly determined by a part where the second storage capacity wire 52b overlaps the second thin section 31b.

At this point, because the entirety of the first thin section 31a is formed in the first on-conductor area 38a of the gate insulating film, the first storage capacity wire 52a has error tolerance with respect to the first thin section 31a. For this reason a capacitance value of the capacity C1 scarcely changes even if the line width of the first storage capacity wire 52a is inconsistent or misalignment occurs, on condition that no edge of the capacity C1 overlaps the first thin section 31a.

In addition to the above, the first thin section 31a is provided in the area where the gate insulating film overlaps the first pixel electrode 17a (i.e. the entirety of the first thin section 31a overlaps the first pixel electrode 17a). Therefore the first pixel electrode 17a has error tolerance with respect to the first thin section 31a. For this reason the capacity C1 scarcely changes even if the width of the first pixel electrode 17a is inconsistent or misalignment occurs, on condition that no edge of the capacity C1 overlaps the first thin section 31a.

As a result of the above, in the present active matrix substrate, it is possible to restrain capacitance values of the capacities C1 from being inconsistent within the substrate, and hence it is possible to restrain the degrees of control of electric potentials of the first pixel electrode 17a from being inconsistent within the substrate. On this account a display apparatus adopting the present active matrix substrate has improved display quality. That is to say, when a display apparatus which performs multi-pixel drive by Cs control (control using a storage capacity wire) displays a predetermined halftone, exposure areas (display areas) corresponding to respective exposure steps are different in terms of brightness (because, when the active matrix substrate is fabricated, exposure amounts are different among the respective exposure steps and hence the line width of the resist pattern is inconsistent or misalignment occurs, with the result that capacitance values of the capacities formed by the storage capacity wires and the pixel electrodes become inconsistent within the substrate). The present embodiment makes it possible to effectively restrain differences among capacitance values of the capacities C1 within the substrate, and hence the problem above is overcome.

Similarly, the second thin section 31b is provided in the second on-conductor area 38b of the gate insulating film, and hence the second storage capacity wire 52b has error tolerance with respect to the second thin section 31b. Therefore a capacitance value of the capacity C2 scarcely changes even if the line width of the second storage capacity wire 52b is inconsistent or misalignment occurs, on condition that no edge of the capacity C2 overlaps the second thin section 31b.

In addition to the above, since the second thin section 31b is provided in the area where the gate insulating film overlaps the second pixel electrode 17b, the second pixel electrode 17b has error tolerance with respect to the second thin section 31b. Therefore the capacity C2 scarcely changes even if the width of the second pixel electrode 17b is inconsistent or misalignment occurs, on condition that no edge of the capacity C2 overlaps the second thin section 31b.

Because of the above, the present active matrix substrate makes it possible to restrain capacitance values of the capacities C2, i.e. the degrees of control of electric potentials of the second pixel electrode 17b, from being inconsistent within the substrate, and hence a display apparatus adopting the present active matrix substrate has improved display quality. In other words, since the present embodiment effectively restrains the problem that capacitance values of the capacities C2 are inconsistent within the substrate, it is possible to overcome the aforesaid problem that, when a display apparatus which performs multi-pixel drive by Cs control displays a predetermined halftone, display areas corresponding to the respective exposure steps are different in brightness.

Each of the storage capacity wires 52a and 52b and the scanning signal line 16 (gate electrode) is, for example, a single-layer film or a multilayer film made of a metal such as titanium, chromium, aluminum, molybdenum, tantalum, tungsten, and copper, or an alloy thereof. The storage capacity wires and the scanning signal line (gate electrode) are, for example, about 100 nm through 300 nm (1000 Å through 3000 Å) thick.

The first gate insulating layer 21 may be made of an insulating material (e.g. a material including an organic matter), for example a spin on glass (SOG) material. SOG materials can form a glass film (silica film) by a spreading method such as spin coating. Among SOG materials, for example a spin on glass material including an organic matter (so-called organic SOG material) is suitably used. Examples of organic SOG materials which can be particularly suitably used include an SOG material having an Si—O—C bond backbone and an SOG material having an Si—C bond backbone. Since an organic SOG material has a low relative dielectric constant and is easily formed into a thick film, use of an organic SOG material reduces the relative dielectric constant of the first gate insulating layer 21 and makes it easy to form a thick first gate insulating layer 21. Furthermore, the use of an organic SOG material makes it possible to flatten the first gate insulating layer 21. In the present embodiment, the first gate insulating layer 21 is arranged to be about 1.5 μm through 2.0 μm thick. Apart from the aforesaid SOG materials, examples of materials including organic matters include an acrylic resin material, epoxy resin, polyimide resin, polyurethane resin, polysiloxane resin, and novolac resin.

Examples of the SOG material having the aforesaid Si—O—C bond are materials disclosed in Japanese Unexamined Patent Publication No. 2001-98224 and Japanese Unexamined Patent Publication No. 6-240455, and DD1100 manufactured by Dow Corning Toray, which is disclosed in IDW '03 preprints, p. 617. An example of the SOG material having the aforesaid Si—C bond is a material disclosed in Japanese Unexamined Patent Publication No. 10-102003.

Alternatively, the first gate insulating layer 21 may be made of an organic SOG material containing a silica filler. In this case, a preferable construction is such that a silica filler is dispersed in a substrate made of an organic SOG material. Such a construction makes it possible to form a first gate insulating layer 21 without crack generation, even if a large substrate 20 is adopted. The grain diameter of a silica filler is 10 nm through 30 nm, for example, and the degree of mixing thereof falls within the range of 20 volume % to 80 volume %. An example of an organic SOG material containing a silica filler is LNT-025 manufactured by Catalyst Chemistry.

The second gate insulating layer 22 is an insulating film formed on the first gate insulating layer 21. In the present embodiment, the second gate insulating layer 22 is made of silicon nitride (SiNx), and the silicon nitride film is about 300 nm through 500 nm (3000 Å through 5000 Å) thick.

Each of the data signal line 15, the source electrode 9, and the drain electrode 8 (see FIG. 1) may be a single-layer film or a multilayer film made of a metal such as titanium, chromium, aluminum, molybdenum, tantalum, tungsten, and copper, or an alloy thereof. These members are, for example, about 100 nm through 300 nm (1000 Å through 3000 Å) thick.

The first interlayer insulating film 25 (channel protection film) is an inorganic insulating film made of silicon nitride, silicon oxide, or the like, or is a film formed by stacking these inorganic insulating films, or the like. In the present embodiment, the film 25 is made of silicon nitride which is about 200 nm through 500 nm (2000 Å through 5000 Å) thick.

The first and second pixel electrodes 17a and 17b formed on the first interlayer insulating film 25 are, for example, formed by a transparent conductive film made of a material such as ITO, IZO, zinc oxide, and tin oxide. The thickness thereof is about 100 nm through 200 nm (1000 Å through 2000 Å).

The following provides an example of the present active matrix substrate with reference to FIG. 2.

First, on a transparent insulating substrate 20, a film of titanium, chromium, aluminum, molybdenum, tantalum, tungsten, and copper, or an alloy thereof is made by a method such as sputtering. By patterning this metal film or alloy film by photo etching or the like, a storage capacity wire 52a and a scanning signal line (the gate electrode of each TFT) are formed.

Subsequently, by spin-coating, an SOG material or the like is applied so that it covers the storage capacity wire 52a and the scanning signal line (gate electrode). As a result of this a first gate insulating layer 21 (flattening film) is formed. After applying photo resist onto the first gate insulating layer 21, exposure is performed using a photo mask. Then development is carried out. Then the first gate insulating layer 21 is removed by dry etching. The dry etching may use, for example, a gas which is a mixture of $CF_4$ and $O_2$. By adjusting the mixture ratio of $CF_4$ and oxygen $O_2$, the areas around the edges of the part from which the first gate insulating layer has been removed are arranged to have a forward tapered shape.

In this way, the thin section 31a shown in FIG. 2 is formed by patterning the first gate insulating layer 21.

In the present embodiment, the first thin section 31a is provided within the first on-conductor area 38a (of the gate insulating film 40). Furthermore, to improve the properties of the first and second TFTs 12a and 12b (see FIG. 1), the thin section 31t is provided in the below-channel area of each TFT.

Subsequent to the above, after the second gate insulating layer 22 and semiconductor layers (high-resistance semiconductor layer and low-resistance semiconductor layer) are successively formed by plasma CVD (Chemical Vapor Deposition) or the like, pattern formation is carried out by photo etching or the like.

Then a data signal line, a source electrode, and a drain electrode are formed. These members can be formed in the same manufacturing step. In concrete terms, a film is made by sputtering or the like from titanium, chromium, aluminum, molybdenum, tantalum, tungsten, and copper, or an alloy thereof, and this metal film or alloy film is patterned to have a required shape by photo-etching or the like.

Thereafter, channel etching by dry etching is performed with respect to high-resistance semiconductor layers (i-layers) such as an amorphous silicon film and low-resistance semiconductor layers (n+ layers) such as an n+ amorphous silicon film, by using patterns of the data signal line, source electrode, and drain electrode as a mask, with the result that first and second TFTs 12a and 12b (see FIG. 1) are formed. In other words, semiconductor layers which are not covered by the data signal line, source electrode, and drain electrode are etched away, and hence the i-layers required to allow each TFT to have its properties remain.

Then a first interlayer insulating film 25 for protecting (covering) the channel of the TFT is formed. In the present embodiment, an inorganic insulating film made of silicon nitride, silicon oxide, or the like, is formed by plasma CVD or the like.

Contact holes 11a and 11b (see FIG. 1) are, for example, formed in such a way that a photosensitive resist is patterned by photolithography (exposure and development) and then etched.

On the first interlayer insulating film 25, a transparent conducting film made of ITO, IZO, zinc oxide, tin oxide, or the like is formed by sputtering or the like, and this film is patterned to have a required shape by photo-etching or the like. As a result a first pixel electrode 17a is formed. In this way the present active matrix substrate is fabricated.

Figure 3:
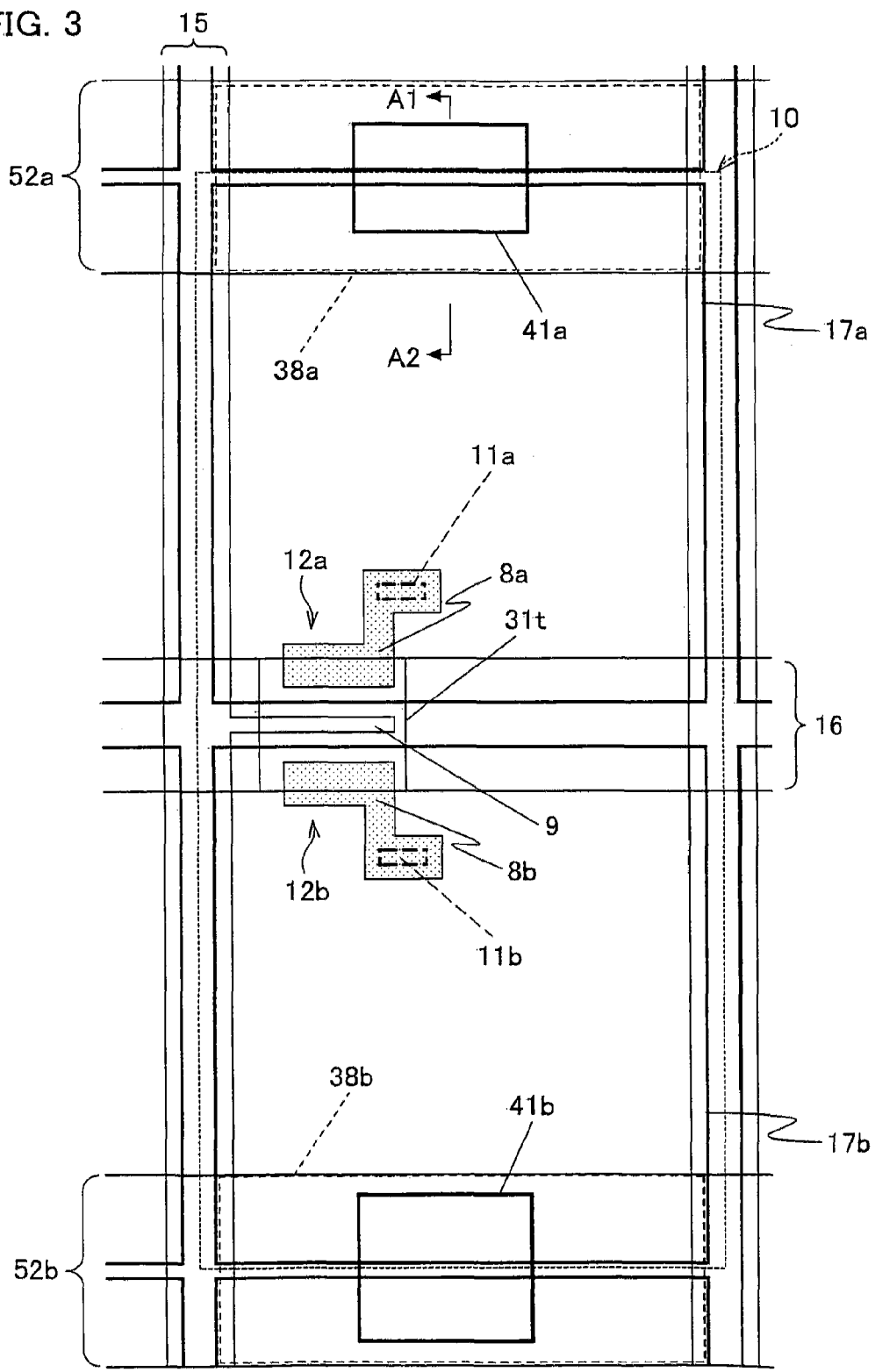
FIG. 3 is a plan view of the active matrix substrate of Embodiment 1.
Figure 4:
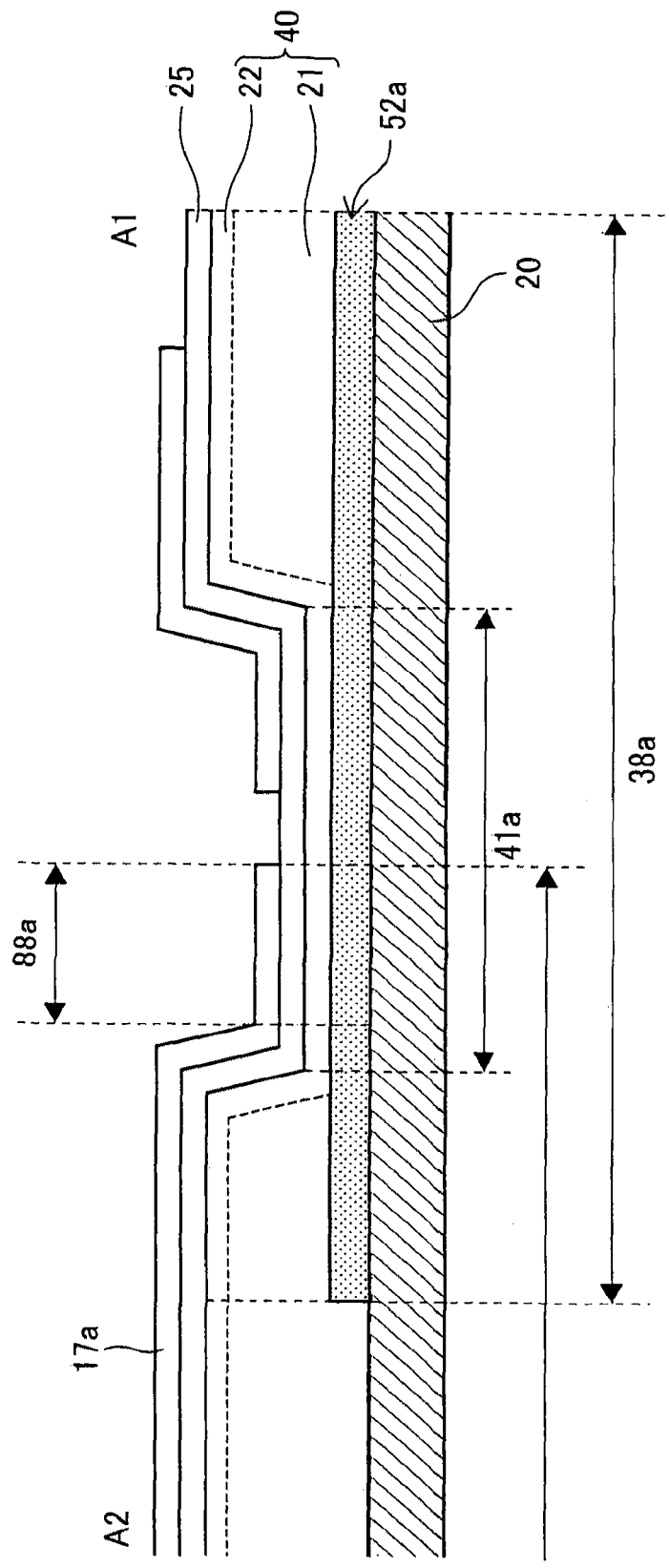
FIG. 4 is a cross section of the active matrix substrate of Embodiment 1.

As shown in FIGS. 3 and 4, the present active matrix substrate may be alternatively arranged such that a part of the first thin section 41a overlaps the first pixel electrode 17a and a part of the second thin section 41b overlaps the second pixel electrode 17b. Apart from this, this active matrix substrate is identical with the substrate shown in FIGS. 1 and 2.

Also in the active matrix substrate shown in FIGS. 3 and 4, the entirety of the first thin section 41a is provided within the first on-conductor area 38a of the gate insulating film, and hence the first storage capacity wire 52a has error tolerance with respect to the first thin section 41a. Therefore a capacitance value of the capacity (storage capacitor) Cx formed between the first pixel electrode 17a and the first storage capacity wire 52a scarcely changes even if the line width of the first storage capacity wire 52a is inconsistent or misalignment occurs, on condition that no edge of the capacity Cx overlaps the first thin section 41a.

Figure 25:
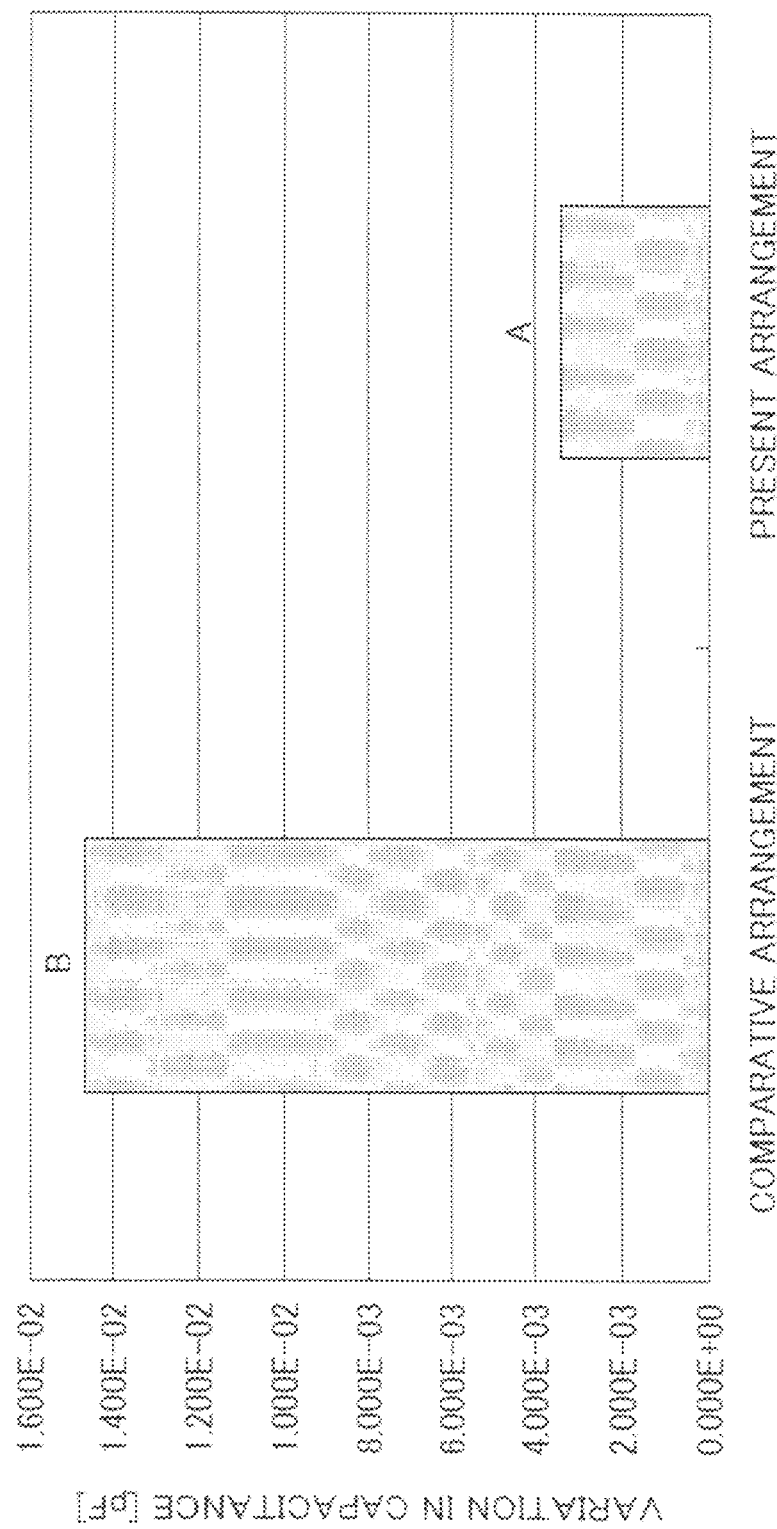
FIG. 25 is a graph showing results of simulation of a variation in a storage capacitor due to a variation in line width of a storage capacity wire, in the present arrangement and in a comparative arrangement.

Now, FIG. 25 shows the result (graph A) of simulation of a variation in the capacity Cx in the active matrix substrate shown in FIGS. 3 and 4, when the line width of the first storage capacity wire 52a deviates 2 μm (1 μm for each side; 2 μm in total) and the result (graph B) of simulation of a variation in the capacity Cx' of a comparative arrangement which is identical with the arrangement shown in FIGS. 3 and 4 except that the first thin section 41a is not provided (i.e. the first gate insulating layer 21 is not provided and only the second gate insulating layer 22 having uniform thickness is provided), when the line width of the first storage capacity wire 52a deviates 2 μm. These simulations presuppose that a 45-inch (1920×RGB×1080 resolution) liquid crystal display apparatus is used and in this apparatus a relative dielectric constant of the first gate insulating layer 21 is 3.5, relative dielectric constants of the first gate insulating film 22 (silicon nitride) and the first interlayer insulating film 25 (silicon nitride) are both 7.0, the first gate insulating film 21 is 1.2 μm thick, the second gate insulating film 22 is 400 nm thick, and the first interlayer insulating film 25 is 250 nm thick.

The simulation results shown in FIG. 25 indicate that a variation in the capacity Cx in the present active matrix substrate 10 (in which the first thin section 41a is provided) is significantly smaller than a variation in the capacity Cx' in the comparative arrangement (in which a thin section is not provided).

Figure 26:
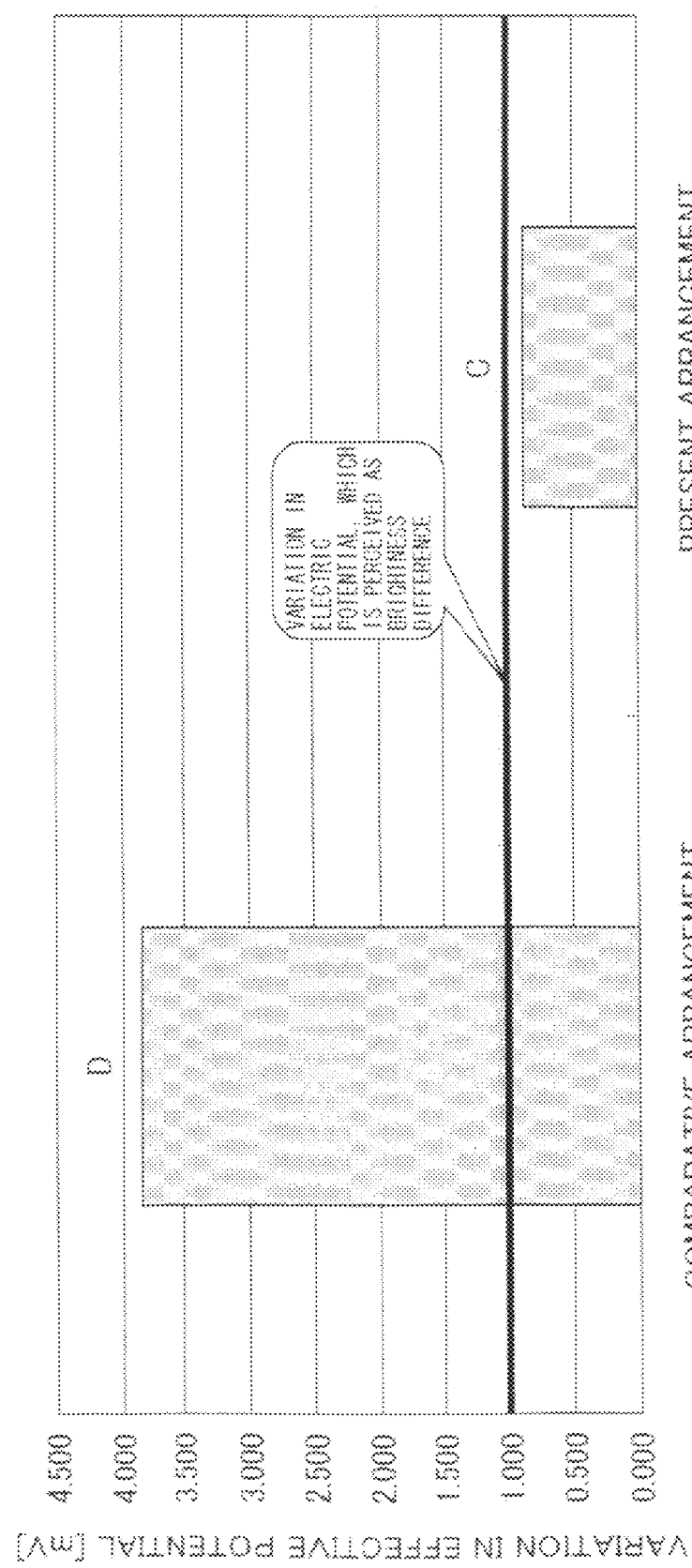
FIG. 26 is a graph showing results of simulation of a variation in effective potential due to a variation in line width of a storage capacity wire, in the present arrangement and a comparative arrangement.

In the graph C (0.9 mV) in FIG. 26, a variation in the capacity (storage capacitor) Cx is represented as a variation in an effective potential (of the first pixel electrode) in halftone display (in this case display at a gray level of 110 in 256 displayable gray levels). In the graph D (3.9 mV) in FIG. 26, a variation in the capacity Cx' is represented as a variation in an effective potential (of the first pixel electrode) in halftone display (at a gray level of 110).

Considering that a difference in brightness from the surrounding areas is not perceived if a variation in the effective potential is not higher than 1 mV, a perceivable brightness difference does not appear on the present active matrix substrate 10 when the line widths of the first storage capacity wires 52a have an error of 1 μm, but a perceivable brightness difference appears in the case of the comparative arrangement, and the display quality is influenced thereby.

Figure 27:
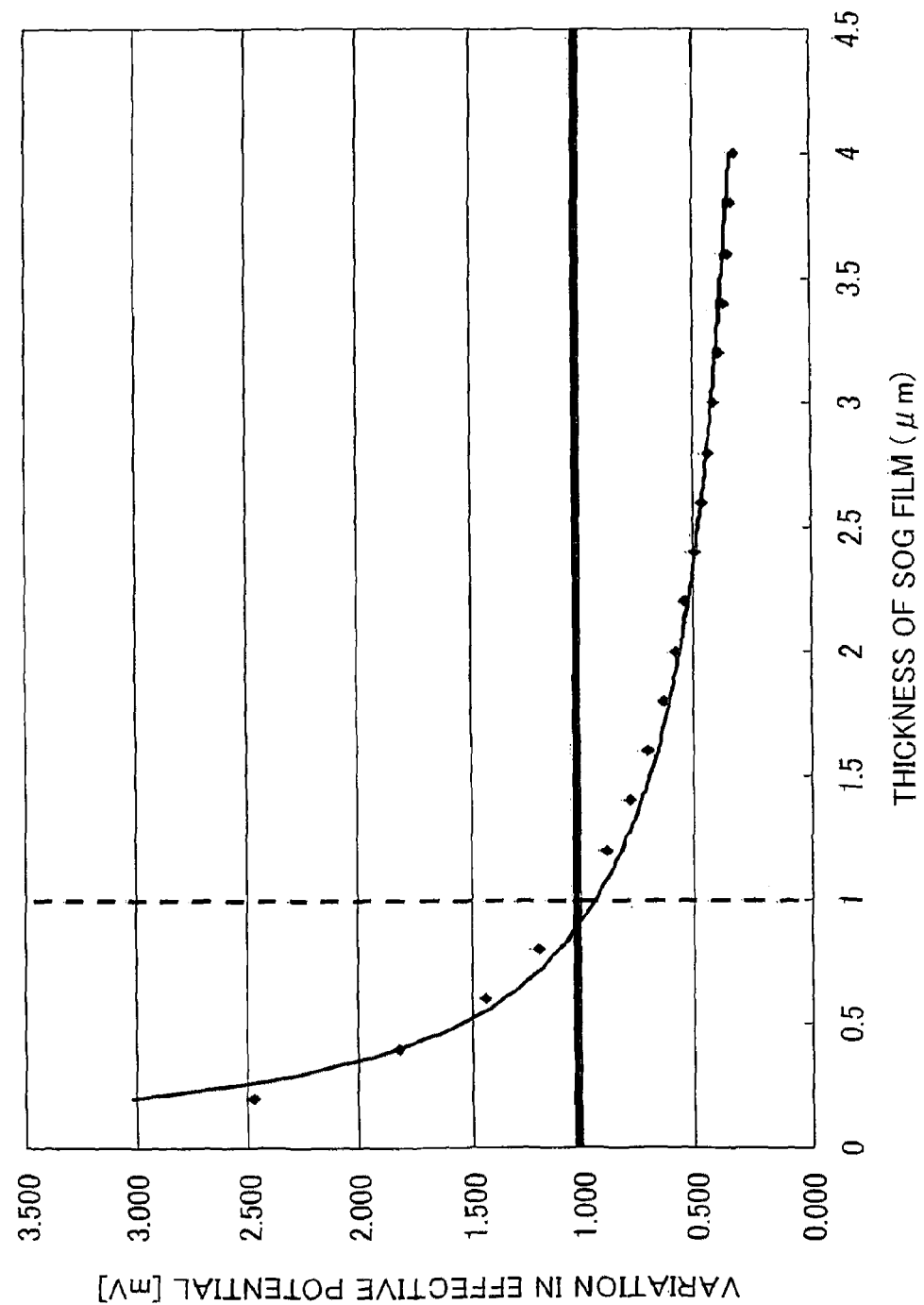
FIG. 27 is a graph showing how a variation in effective potential varies in response to a change in the thickness of a first gate layer (SOG film), in the aforesaid simulation concerning the present arrangement.

FIG. 27 relates to the graph C in FIG. 26 and is a graph showing how a variation of the effective potential changes when the thickness (SOG thickness) of the first gate insulating layer 21 is changed (the graph C shows a case where the thickness is 1.2 μm). Because the variation of the effective potential falls within the range of 1.0 mV (the threshold of a perceivable brightness difference) when the thickness of the first gate insulating layer 21 is 1.0 μm, it turns out that the minimum thickness of the first gate insulating layer 21 is 1.0 μm if an error of the line width of the first storage capacity wire 52a is not wider than 2 μm (1 μm for each side; 2 μm in total).

Figure 28:
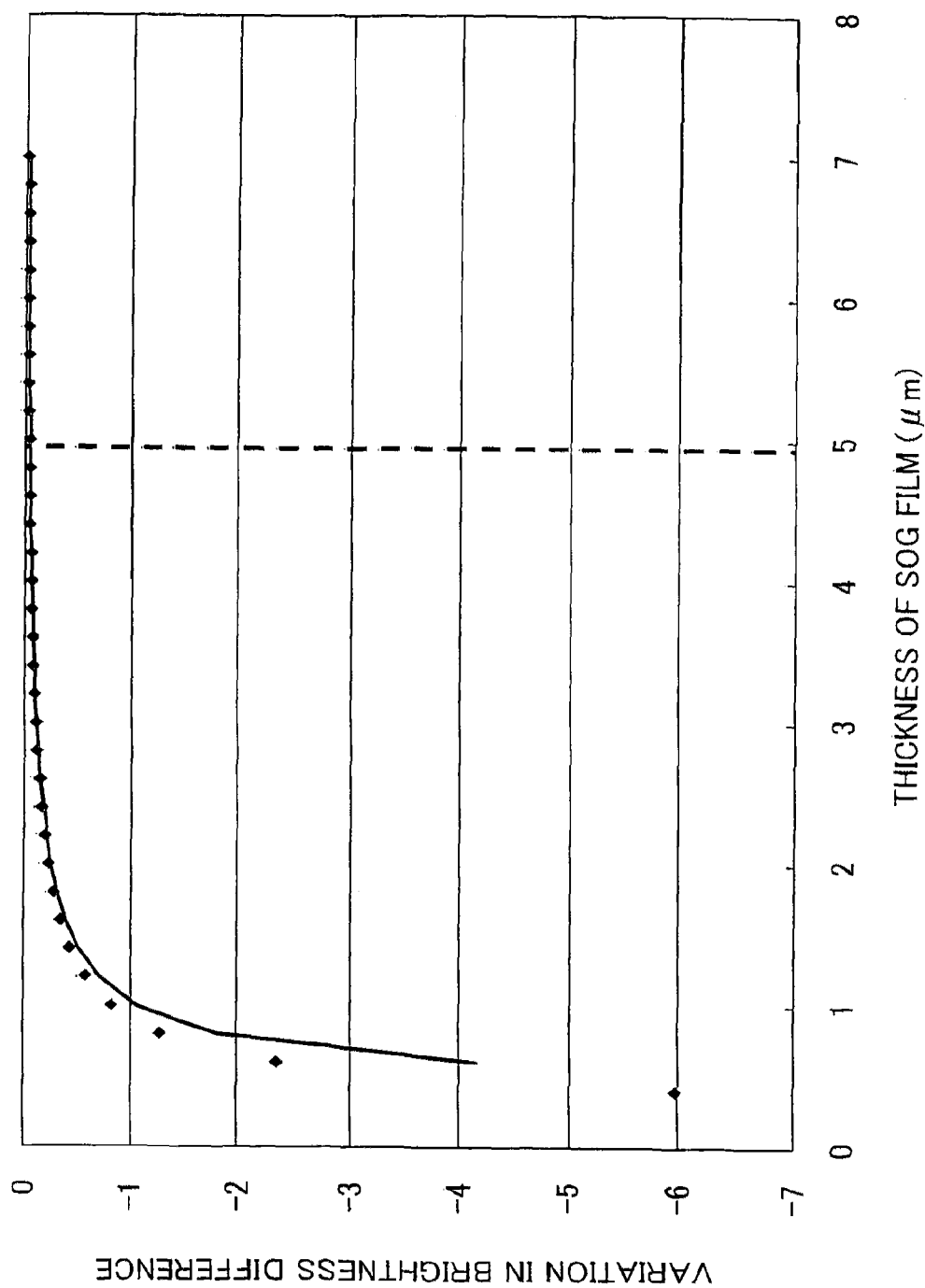
FIG. 28 is a graph showing how a variation in brightness difference varies in response to a change in the thickness of the first gate layer (SOG film), in the aforesaid simulation concerning the present arrangement.

FIG. 28 is a graph showing the relationship between the thickness (SOG thickness) of the first gate insulating layer 21 and a variation in brightness difference. The figure shows that a variation in brightness difference is substantially 0 when the thickness of the first gate insulating layer 21 is not lower than 5.0 μm. It is noted that, because the first gate insulating layer 21 (SOG film) is formed by spin coating, the thickness of the first gate insulating layer 21 may not be even when it is too thick. In consideration of this, the thickness of the first gate insulating layer 21 is preferably not greater than 4.0 μm.

Figure 9:
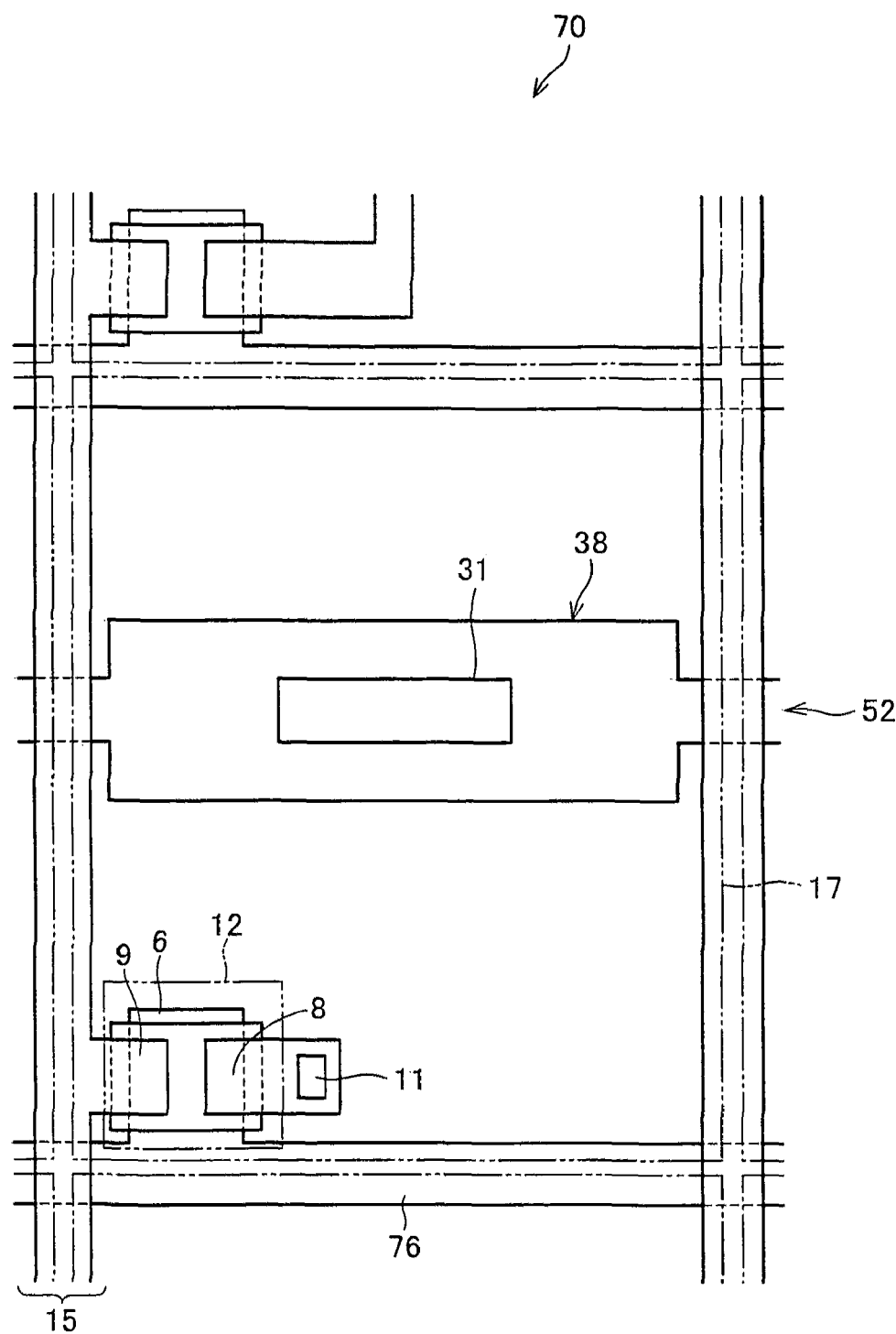
FIG. 9 is a plan view of the active matrix substrate of Embodiment 1.

The present active matrix substrate may be arranged as shown in FIG. 9. The active matrix substrate shown in FIG. 9 is arranged such that each pixel area 70 is provided with a TFT 12, a pixel electrode 17, and a contact hole 11. The present active matrix substrate is provided with a scanning signal line 76 extending in the horizontal direction in the figure and a data signal line 15 extending in the vertical direction in the figure, which are arranged to be perpendicular to each other.

The TFT 12 is provided with a source electrode 9 and a drain electrode 8, and its gate electrode 6 is an extension of the scanning signal line. The source electrode 9 is connected to the data signal line 15, whereas the drain electrode 8 is connected to the pixel electrode 17 through the contact hole 11. The pixel electrode 17 is a transparent electrode made of ITO or the like, and allows light (backlight beam) coming from below the present active matrix substrate to pass through.

On the present active matrix substrate, a storage capacity wire 52 is formed at the center of the pixel area so that it extends in the direction along the scanning signal line 76.

The pixel electrode 17 functions as an electrode of a capacity C, whereas the storage capacity wire 52 functions as the other electrode of the capacity C. This capacity C also functions as a storage capacitor.

In the present active matrix substrate, data (signal potential) from the data signal line 15 is supplied to the pixel electrode 17 via the source electrode 9 and the drain electrode 8 of the TFT 12.

The present active matrix substrate is provided with a gate insulating film which covers the scanning signal line (gate electrode of each transistor) and the storage capacity wire. Because of this, the gate insulating film has, on the pixel area 70, an on-conductor area 38 which overlaps the storage capacity wire 52.

In the present embodiment, a thin section 31 with reduced thickness is formed in the on-conductor area 38 of the gate insulating film. The gate insulating film has plural gate insulating layers. The thin section 31 is formed by partly removing or thinning at least one of the gate insulating layers. More specifically, the thin section 31 has a horizontally-long rectangular shape and is locally formed around the center of the on-conductor area 38.

Also in the arrangement shown in FIG. 9, the thin section 31 is provided in the on-conductor area 38 of the gate insulating film, and hence the storage capacity wire 52 has error tolerance with respect to the thin section 31. Therefore a capacitance value of the capacity C scarcely changes even if the line width of the storage capacity wire 52 is inconsistent or misalignment occurs, on condition that no edge of the capacity C overlaps the thin section 31.

Furthermore, since the thin section 31 is provided in the area where the gate insulating film overlaps the pixel electrode 17 (i.e. the entirety of the thin section 31 overlaps the pixel electrode 17), the pixel electrode 17 has error tolerance with respect to the thin section 31. Therefore a capacitance value of the capacity C scarcely changes even if the width of the pixel electrode 17 is inconsistent or misalignment occurs, on condition that no edge of the capacity C overlaps the thin section 31.

Figure 19:
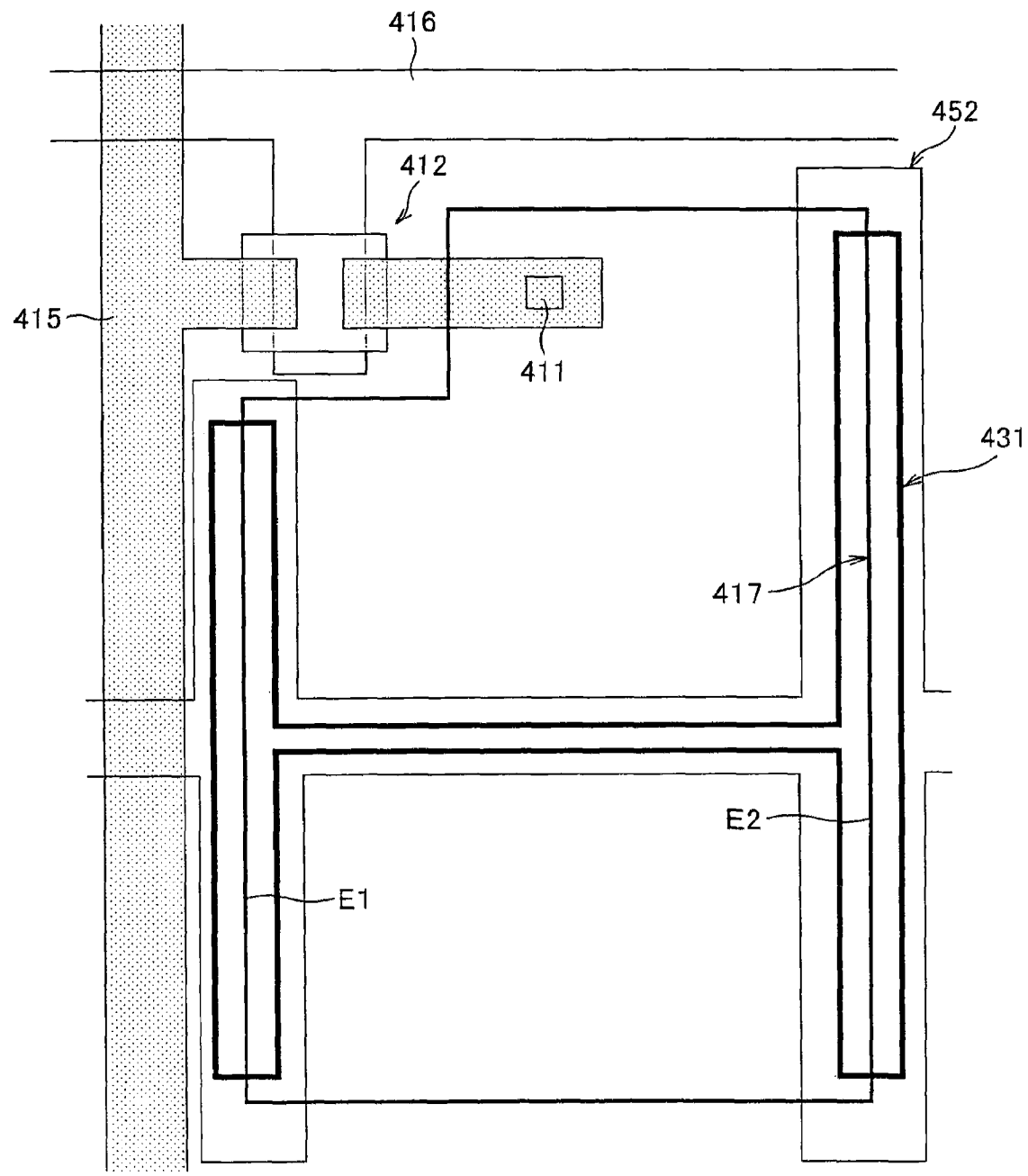
FIG. 19 is a plan view showing another example of the active matrix substrate of Embodiment 1.

The present active matrix substrate may be arranged as shown in FIG. 19. As shown in FIG. 19, the active matrix substrate is arranged such that each pixel area is provided with a TFT 412, a pixel electrode 417 (capacity electrode), a storage capacity wire 452 (conductor), and a scanning signal line 416 extending in the horizontal direction in the figure and a data signal line 415 extending in the vertical direction in the figure, which are arranged to be perpendicular to each other.

The storage capacity wire 452 is arranged to be H-shaped so that it overlaps, among the edges of the pixel electrode 417, an edge E1 along the data signal line 415 and an edge E2 opposing the edge E1. As a result of this, the storage capacitor C is formed in the area where the pixel electrode 417 overlaps the storage capacity wire 452. Although not illustrated, a gate insulating film is formed so as to cover the surface of the storage capacity wire 452.

In the present embodiment, as shown in FIG. 19, a thin section 431 with reduced thickness is formed in an area of the gate insulating film, the area being on the conductor. The thin section 431 is H-shaped. The entirety of the thin section 431 overlaps the storage capacity wire 452 and a part thereof overlaps the pixel electrode 417. On account of this arrangement, the storage capacitor C is dominantly determined by the area where the pixel electrode 417, the storage capacity wire 452, and the thin section 431 overlap one another.

Also in the arrangement shown in FIG. 19, the entirety of the thin section 431 is provided in the on-conductor area of the gate insulating film, and hence the storage capacity wire 452 has error tolerance with respect to the thin section 431. Therefore a capacitance value of the storage capacitor C scarcely changes even if the line width of the storage capacity wire 452 is inconsistent or misalignment occurs, on condition that no edge of the storage capacitor C overlaps the thin section 431.

Furthermore, the thin section 431 is arranged so that the entirety thereof overlaps the storage capacity wire 452 and parts thereof overlap the edges E1 and E2 of the pixel electrode 417. For this reason the area where the pixel electrode 417 overlaps the thin section 431 compensates horizontal misalignment of the pixel electrode 417 or the thin section 431, and hence a capacitance value of the storage capacitor C does not easily change. In addition, since the storage capacity wire 452 is formed so as to overlap the edges E1 and E2 of the pixel electrode 417 as above, the field-shielding effect thereof reduces a parasitic capacity between the pixel electrode and the data signal line.

Figure 20:
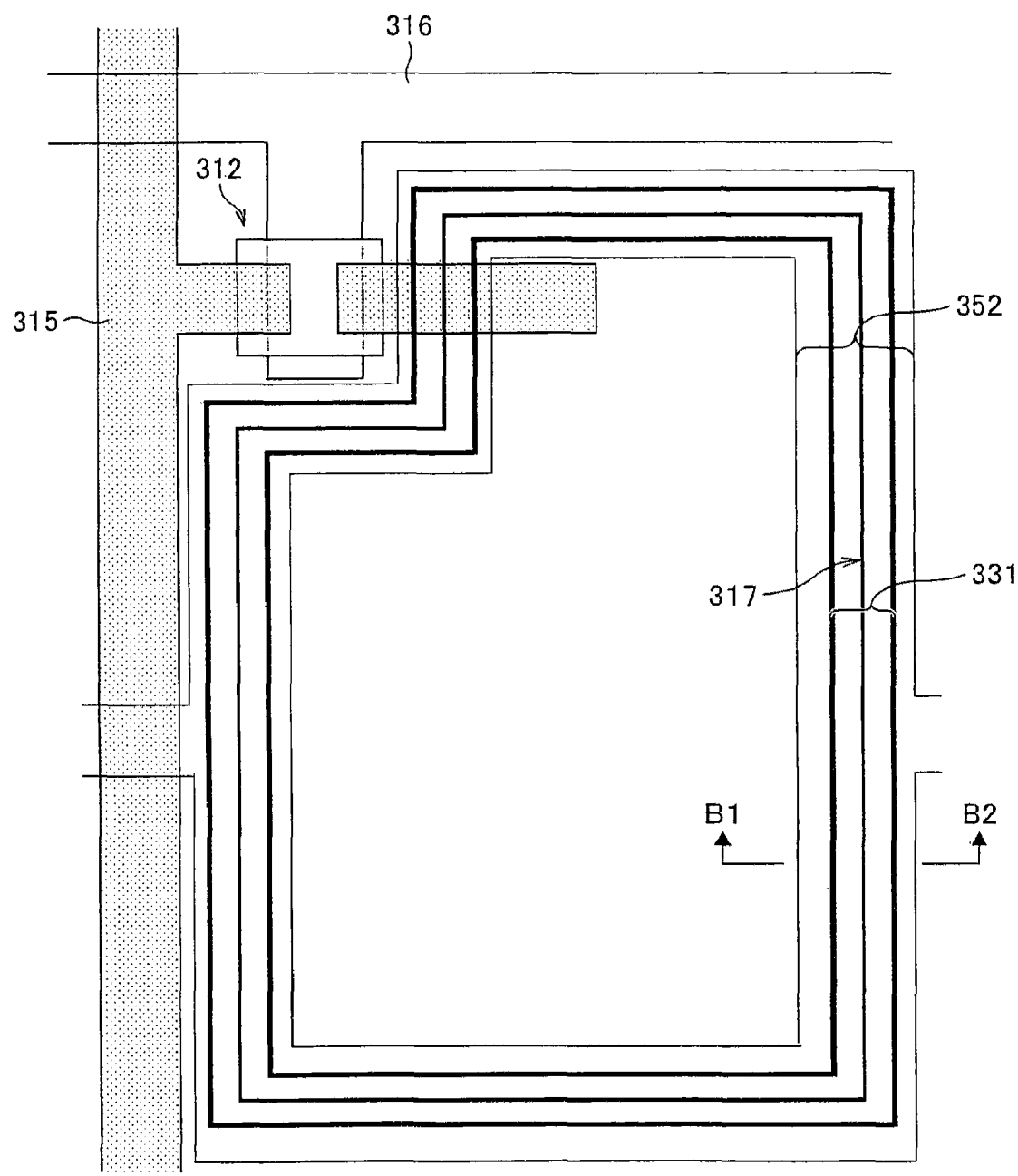
FIG. 20 is a plan view showing another example of the active matrix substrate of Embodiment 1.
Figure 21:
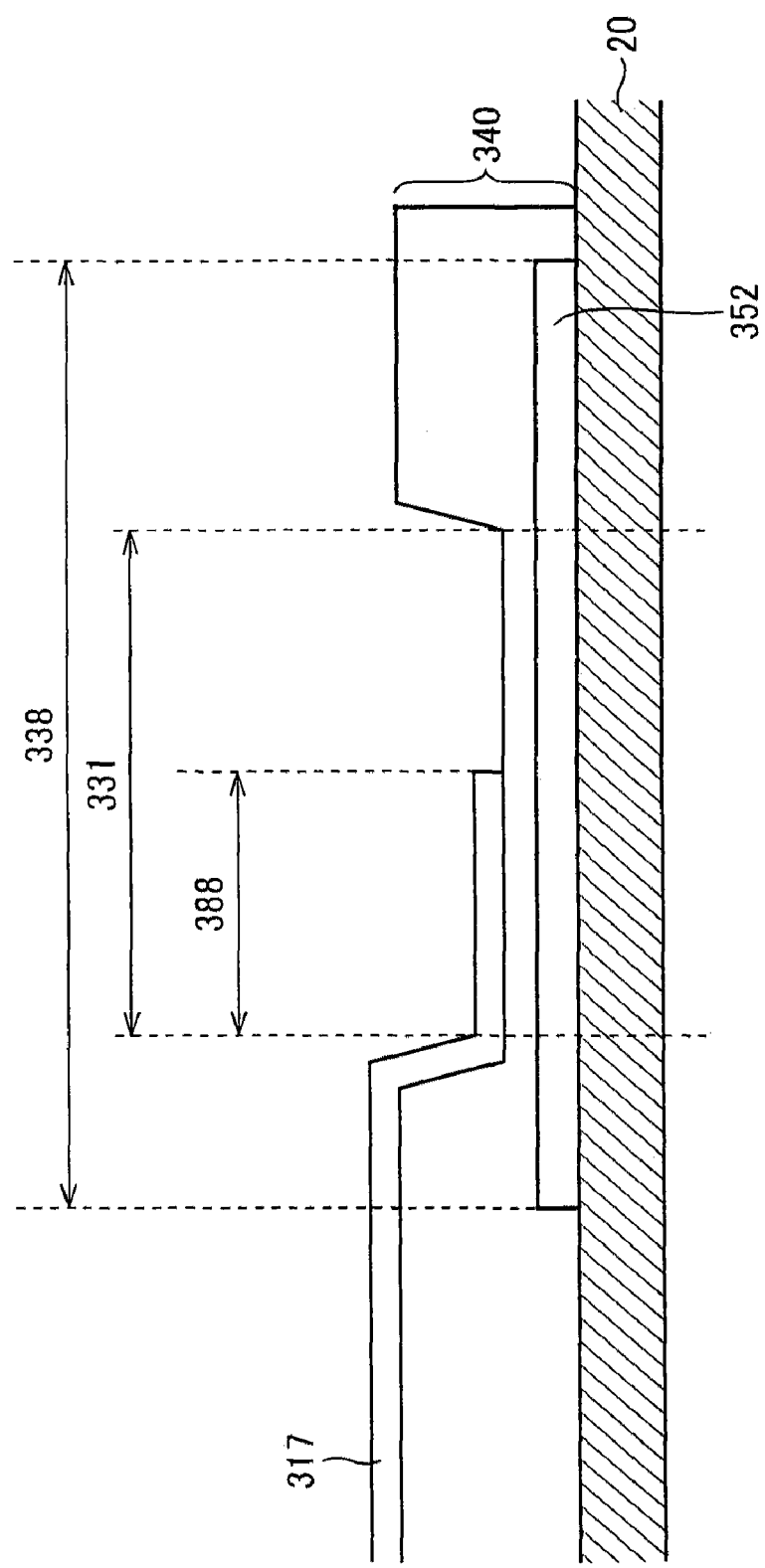
FIG. 21 is a cross section at B1-B2 line in FIG. 20.

The present active matrix substrate may be arranged as shown in FIG. 20. FIG. 21 is a cross section at B1-B2 line in FIG. 20. As shown in FIG. 20, the present active matrix substrate is arranged such that each pixel area is provided with a TFT 312, a pixel electrode 317 (capacity electrode), a storage capacity wire 352 (conductor), and a scanning signal line 316 extending in the horizontal direction in the figure and a data signal line 315 extending in the vertical direction, which are arranged to be perpendicular to each other.

The storage capacity wire 352 is formed circular so as to overlap the edges of the pixel electrode 317. As a result a storage capacitor C is formed at the area where the pixel electrode 317 overlaps the storage capacity wire 352.

In the present active matrix substrate, as shown in FIG. 21, the storage capacity wire 352 is formed on a substrate 20 and the gate insulating film 340 is formed so as to cover the storage capacity wire 352, and on this gate insulating film 340 the pixel electrode 317 is formed. Therefore this gate insulating film 340 is arranged so that each pixel area is provided with an on-conductor area 338 which overlaps the storage capacity wire 352.

In the present embodiment, as shown in FIGS. 20 and 21, a thin section 331 with reduced thickness is formed in the on-conductor area 338 of the gate insulating film. The thin section 331 is circular. The entirety thereof overlaps the storage capacity wire 352, and a part thereof overlaps pixel electrode 317. As a result, the storage capacitor C is predominantly determined by the area where the pixel electrode 317, the storage capacity wire 352, and the thin section 331 overlap one another.

Also in the arrangement shown in FIG. 20, since the entirety of the thin section 331 is formed in the on-conductor area of the gate insulating film, the storage capacity wire 352 has error tolerance with respect to the thin section 331. Therefore a capacitance value of the storage capacitor C scarcely changes even if the line width of the storage capacity wire 352 is inconsistent or misalignment occurs, on condition that an edge of the storage capacitor C overlaps the thin section 331.

Furthermore, the thin section 331 is arranged so that the entirety thereof overlaps the storage capacity wire 352 and a part thereof overlap an edge of the pixel electrode 317. Therefore horizontal misalignment of the pixel electrode 317 or the thin section 331 is compensated by the area where the pixel electrode 317 overlaps the thin section 331, and hence a capacitance value of the storage capacitor C does not easily change. Also, since the storage capacity wire 352 is formed to overlap, among the edges of the pixel electrode 317, the edge along the data signal line 315 and the edge opposing that edge along the data signal line 315, the field shielding effect thereof reduces a parasitic capacity between the pixel electrode and the data signal line.

Embodiment 2

The following will describe Embodiment 2 of the present invention with reference to FIG. 5 through FIG. 8 and FIG. 10.

Figure 5:
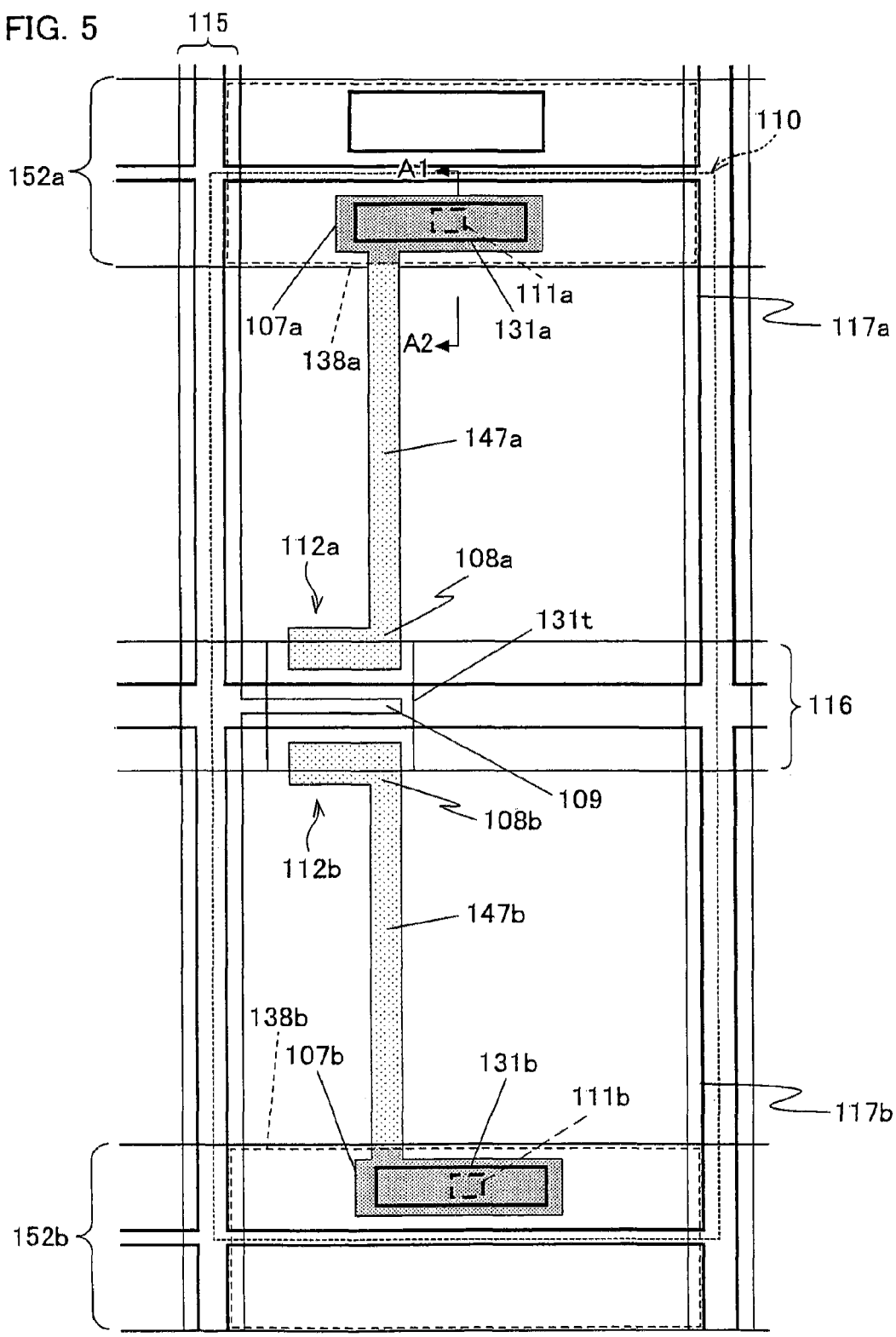
FIG. 5 is a plan view of an active matrix substrate of Embodiment 2.

FIG. 5 is a plan view which outlines an active matrix substrate of the present embodiment. As shown in the figure, the present active matrix substrate is arranged for multi-pixel drive, and one pixel area 110 includes a first TFT (thin film transistor) 112a, a second TFT 112b, a first pixel electrode 117a, a second pixel electrode 117b, a first drain lead electrode 107a, a first drain lead electrode 107b, a first drain lead line 147a, a first drain lead line 147b, a first contact hole 111a, and a second contact hole 111b.

The present active matrix substrate is further provided with a scanning signal line 116 extending in the horizontal direction in the figure and a data signal line 115 extending in the vertical direction in the figure, which are arranged to be perpendicular to one another. Inside the pixel area 110, the first pixel electrode 117a is provided in the upper half, the second pixel electrode 117b is provided in the lower half, and the scanning signal line 116 traverses the central part. This scanning signal line 116 overlaps the first pixel electrode 117a (the lower part of the first pixel electrode 117a in FIG. 5) and the second pixel electrode 117b (the upper part of the second pixel electrode 117b in FIG. 5). The data signal line 115 is formed to overlap the left edges of the first and second pixel electrodes (117a and 117b). Around the intersection of the data signal line 115 and the scanning signal line 116, the first and second TFTs 112a and 112b are formed.

The first TFT 112a includes a source electrode 109 and a first drain electrode 108a, and its gate electrode is a part of the scanning signal line 116. The first TFT 112b includes the source electrode 109 and a second drain electrode 108b, and its gate electrode is a part of the scanning signal line 116. In this way the first and second TFTs 112a and 112b share the source electrode and the gate electrode.

The source electrode 109 is connected to the data signal line 115. The first drain electrode 108a is connected to the pixel electrode 117a, through the drain lead line 147a, the first drain lead electrode 107a, and the contact hole 111a. The second drain electrode 108b is connected to the second pixel electrode 117b, through the second drain lead line 147b, the second drain lead electrode 107b, and the contact hole 111b. The first and second pixel electrodes 117a and 117b are transparent electrodes made of ITO or the like, and allow light (backlight beam) coming from below the present active matrix substrate to pass through.

The present active matrix substrate includes first and second storage capacity wires 152a and 152b formed on a surface of a substrate so as to extend in the horizontal direction in the figure. The first storage capacity wire 152a overlaps the first drain lead electrode 117a, whereas the second storage capacity wire 152b overlaps the second drain lead electrode 107b.

The first drain lead electrode 107a functions as an electrode of a capacity C3, whereas the first storage capacity wire 152a functions as the other electrode of the capacity C3. Similarly, the second drain lead electrode 107b functions as an electrode of a capacity C4, whereas the second storage capacity wire 152b functions as the other electrode of the capacity C4. These capacities C3 and C4 each function as both a storage capacitor and a capacity for controlling an electric potential of the pixel electrode.

In the present active matrix substrate, data (signal potential) on the data signal line 115 is supplied to the first and second pixel electrodes 117a and 117b, through the common source electrode 109 of the TFTs (112a and 112b) and the first and second drain electrodes 108a and 108b. The first and second storage capacity wires 152a and 152b receive signal voltages with inverse polarities, and the first and second pixel electrodes 117a and 117b are controlled so as to have different electric potentials (details will be given later). As a result of this, a bright area and a dark area are formed within each pixel 110, so that a halftone is represented by area coverage modulation. As a result the display quality is improved because, for example, whitish appearance at oblique viewing angles is restrained. It is noted that the storage capacitor is an auxiliary capacity which keeps an electric potential written into each of the pixel electrodes (117a and 117b) until the next data signal is input to each of the pixel electrodes (117a and 117b).

The active matrix substrate is provided with a gate insulating film which covers the scanning signal line (the gate electrode of each transistor) and the storage capacity wire. This gate insulating film therefore has, in the pixel area 110, a first on-conductor area overlapping the first storage capacity wire 152a and a second on-conductor area overlapping the second storage capacity wire 152b.

In the present embodiment, a first thin section 131a with reduced thickness is formed in the first on-conductor area of the gate insulating film. The gate insulating film has plural gate insulating layers. The first thin section 131a is formed by partially removing or thinning at least one of the gate insulating layers. More specifically, the first thin section 131a has a horizontally-long rectangular shape, and is formed in the area where the first on-conductor area overlaps the first pixel electrode 117a. Also, in the second on-conductor area of the gate insulating film, a second thin section 131b with reduced film thickness is formed. The gate insulating film includes the plural gate insulating layers. The second thin section 131b is formed by partially removing or thinning at least one of the gate insulating layers. More specifically, the second thin section 131b has a rectangular shape and is long along the scanning signal line. The second thin section is formed in the area where the second on-conductor area overlaps the second pixel electrode 117b.

In the present embodiment, as shown in FIG. 5, the below-channel area of each TFT is provided with a thin section 131t (whose arrangement is identical with the first or second thin section), in order to improve the properties of the first and second TFTs 112a and 112b.

Figure 6:
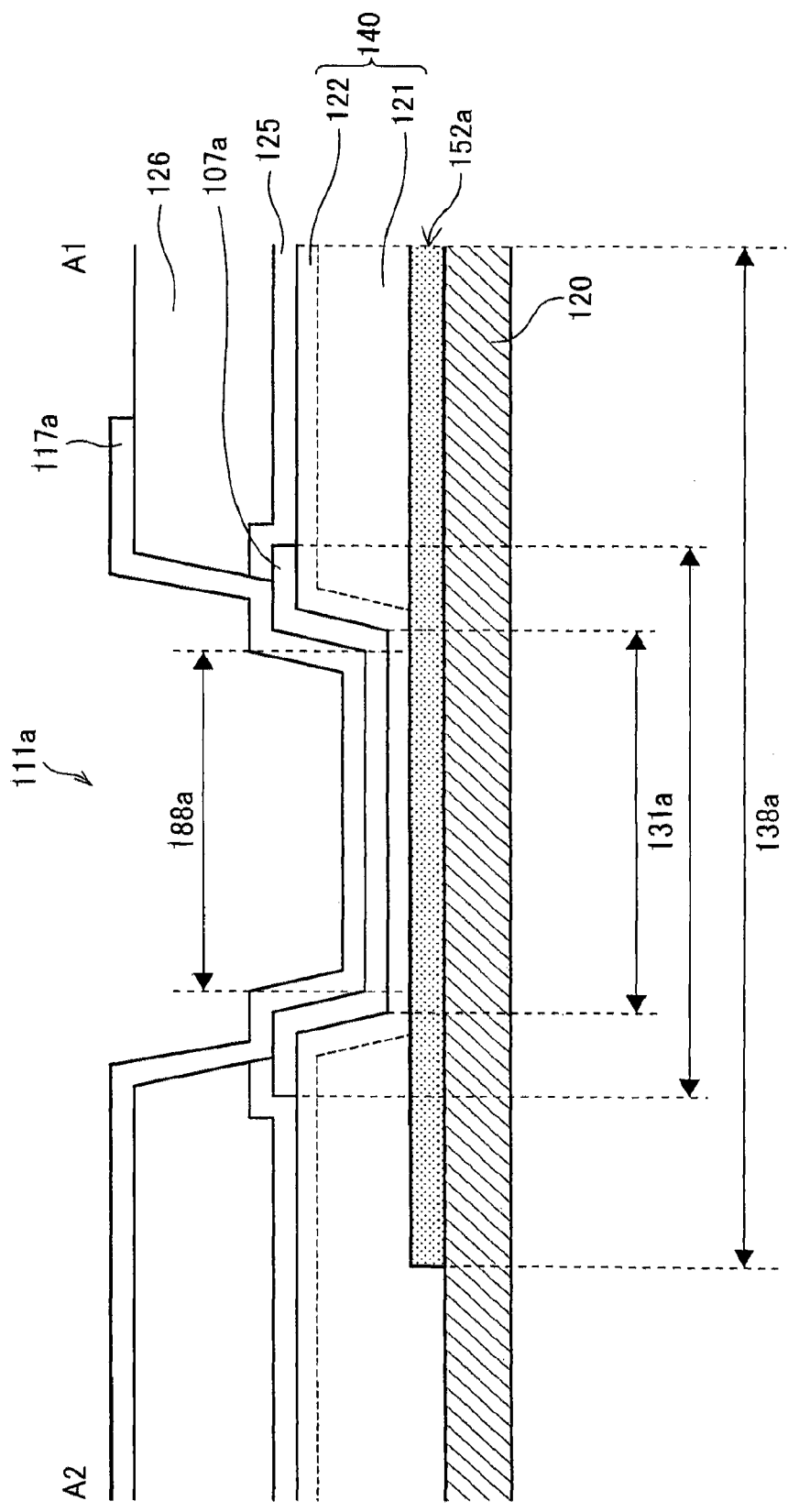
FIG. 6 is a cross section of the active matrix substrate of Embodiment 2.

FIG. 6 is a cross section at A1-A2 line in FIG. 5. As shown in FIGS. 5 and 6, on a glass substrate 120 a first storage capacity wire 152a is formed, and a gate insulating film 140 (covering the scanning signal line 116) covers a surface of the glass substrate and the first storage capacity wire 152a. On this gate insulating film 140 a first drain lead electrode 107a is formed. In such a way as to cover a part of the first drain lead electrode 107a and channel sections of the first and second TFTs 112a and 112b, a first interlayer insulating film 125 is formed. Furthermore, on this first interlayer insulating film 125, a first pixel electrode 117a is formed with a second interlayer insulating film 126 being interposed therebetween. In the contact hole 111a, first and second interlayer insulating films 125 and 126 have been removed and the first drain lead electrode 107a contacts the pixel electrode 117a.

The first interlayer insulating film 125 is an inorganic insulating film made of silicon nitride, silicon oxide, or the like, or is a film formed by stacking these inorganic insulating films, or the like. In the present embodiment, the film 125 is made of silicon nitride which is about 200 nm through 500 nm (2000 Å through 5000 Å) thick. The second interlayer insulating film 126 may be a resin film made of photosensitive acrylic resin or an SOG film. In the present embodiment, the film 126 is a photosensitive acrylic resin film about 2000 nm through 4000 nm (20000 Å through 40000 Å) thick.

The gate insulating film 140 includes a first gate insulating layer 121 made of an SOG material and a second gate insulating layer 122 made of SiNx. At a part of the first on-conductor area 138a, the first gate insulating layer 121 has been removed and a first thin section 131a is formed. On this first thin section 131a the first drain lead electrode 107a is formed, and on this first drain lead electrode 107a the first pixel electrode 117a is formed.

As such, in the gate insulating film, a part of the area between the first storage capacity wire 152a and the first drain lead electrode 107a is arranged to have thinner thickness (i.e. the first thin section 131a is formed), so that a capacitance value of the capacity C3 is predominantly determined by a part 188a where the first storage capacity wire 152a overlaps the first thin section 131a. Similarly, in the gate insulating film, a part of the area between the second storage capacity wire 152b and the second drain lead electrode 107b is arranged to have reduced thickness (i.e. the second thin section 131b is formed). This makes it possible to predominantly determine a capacitance value of the capacity C4 by the area where the second storage capacity wire 152b overlaps the second thin section 131b.

In this case, the entirety of the first thin section 131a is provided within the first on-conductor area 138a of the gate insulating film 140, and hence the first storage capacity wire 152a has error tolerance with respect to the first thin section 131a. Therefore a capacitance value of the capacity (storage capacitor) C3 scarcely changes even if the line width of the first storage capacity wire 152a is inconsistent or misalignment occurs, on condition that no edge of the capacity C3 overlaps the first thin section 131a.

Moreover, since the first thin section 131a is provided in the area where the gate insulating film 140 overlaps the first drain lead electrode 107a (i.e. the entirety of the first thin section 131a overlaps the first drain lead electrode 107a), the first drain lead electrode 107a has error tolerance with respect to the first thin section 131a. Therefore the capacity C3 scarcely changes even if the width of the first drain lead electrode 107a is inconsistent or misalignment occurs, on condition that no edge of the capacity C3 overlaps the first thin section 131a.

Because of the above, in the present active matrix substrate, it is possible to restrain capacitance values of the capacities C3 from being inconsistent within the substrate, and hence it is possible to restrain the degrees of control of electric potentials of the first pixel electrode 117a from being inconsistent within the substrate. On this account a display apparatus adopting the present active matrix substrate has improved display quality. That is to say, when a display apparatus which performs multi-pixel drive by Cs control (control using a storage capacity wire) displays a predetermined halftone, exposure areas (display areas) corresponding to respective exposure steps are different in terms of brightness (because, when the active matrix substrate is fabricated, exposure amounts are different among the respective exposure steps and hence the line width of the resist pattern is inconsistent or misalignment occurs, with the result that capacitance values of the capacities formed by the storage capacity wires and the drain lead electrodes become inconsistent within the substrate). The present embodiment makes it possible to effectively restrain differences among capacitance values of the capacities C3 within the substrate, and hence the problem above is overcome.

Similarly, in the present active matrix substrate, it is possible to restrain capacitance values of the capacities C4 from being inconsistent within the substrate, and hence it is possible to restrain the degrees of control of electric potentials of the first pixel electrode 117b from being inconsistent within the substrate. On this account a display apparatus adopting the present active matrix substrate has improved display quality. That is to say, since it is possible in the present embodiment to effectively restrain differences among capacitance values of the capacities C4 within the substrate, it is possible to solve the aforesaid problem that display areas corresponding to respective exposure steps are different in brightness when a display apparatus performing multi-pixel drive by Cs control displays a predetermined halftone.

Figure 7:
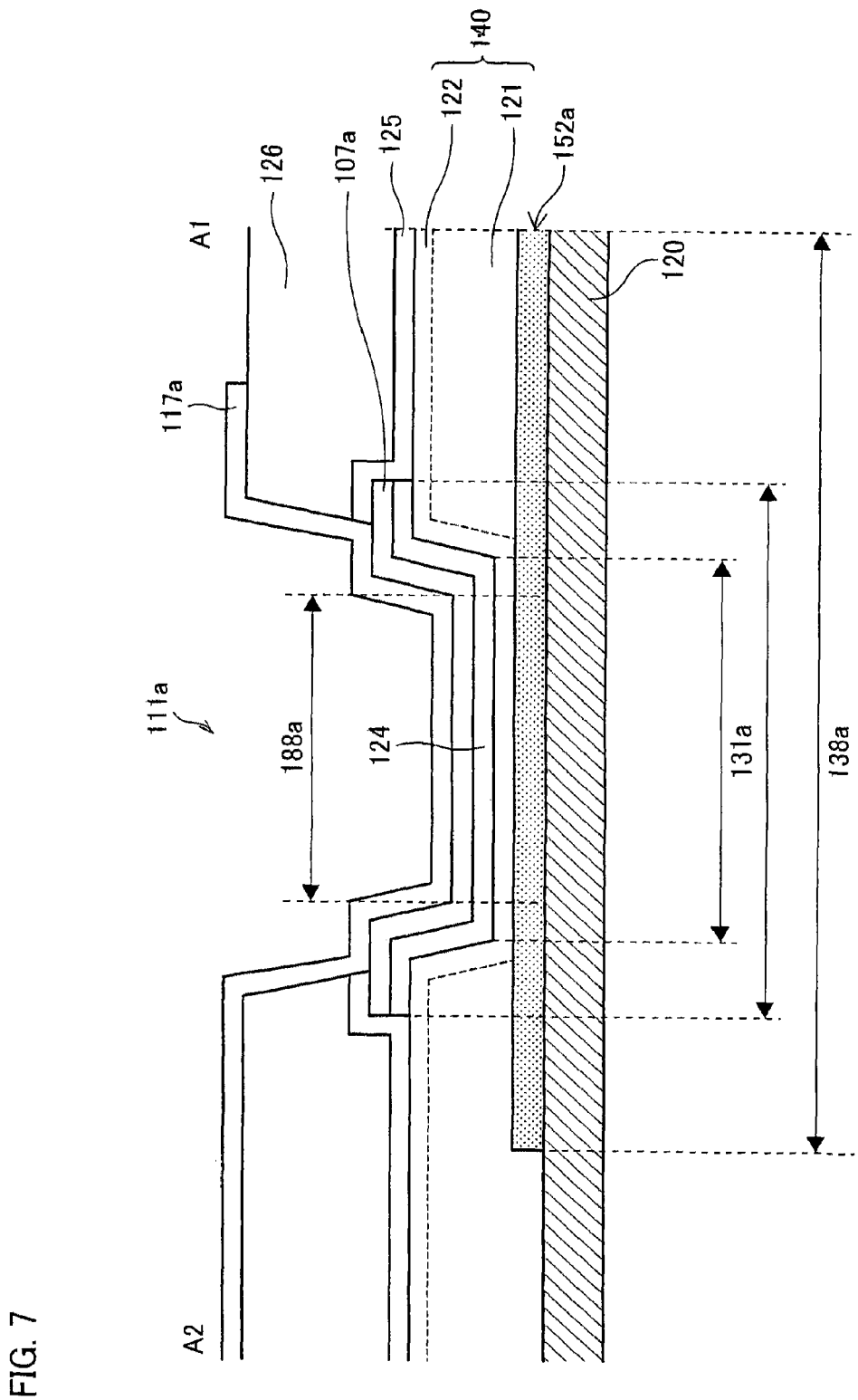
FIG. 7 is a cross section of the active matrix substrate of Embodiment 2.

As shown in FIG. 7, the active matrix substrate of the present embodiment may be arranged such that a semiconductor layer 124 is provided between the first drain lead electrode 107a and the gate insulating film 140 (second gate insulating layer 122). This makes it possible to prevent the first drain lead electrode 107a from being short-circuited with the storage capacity wire 152a, even if a pin hole is made through the second gate insulating layer 122 constituting the thin section 131a.

Figure 8:
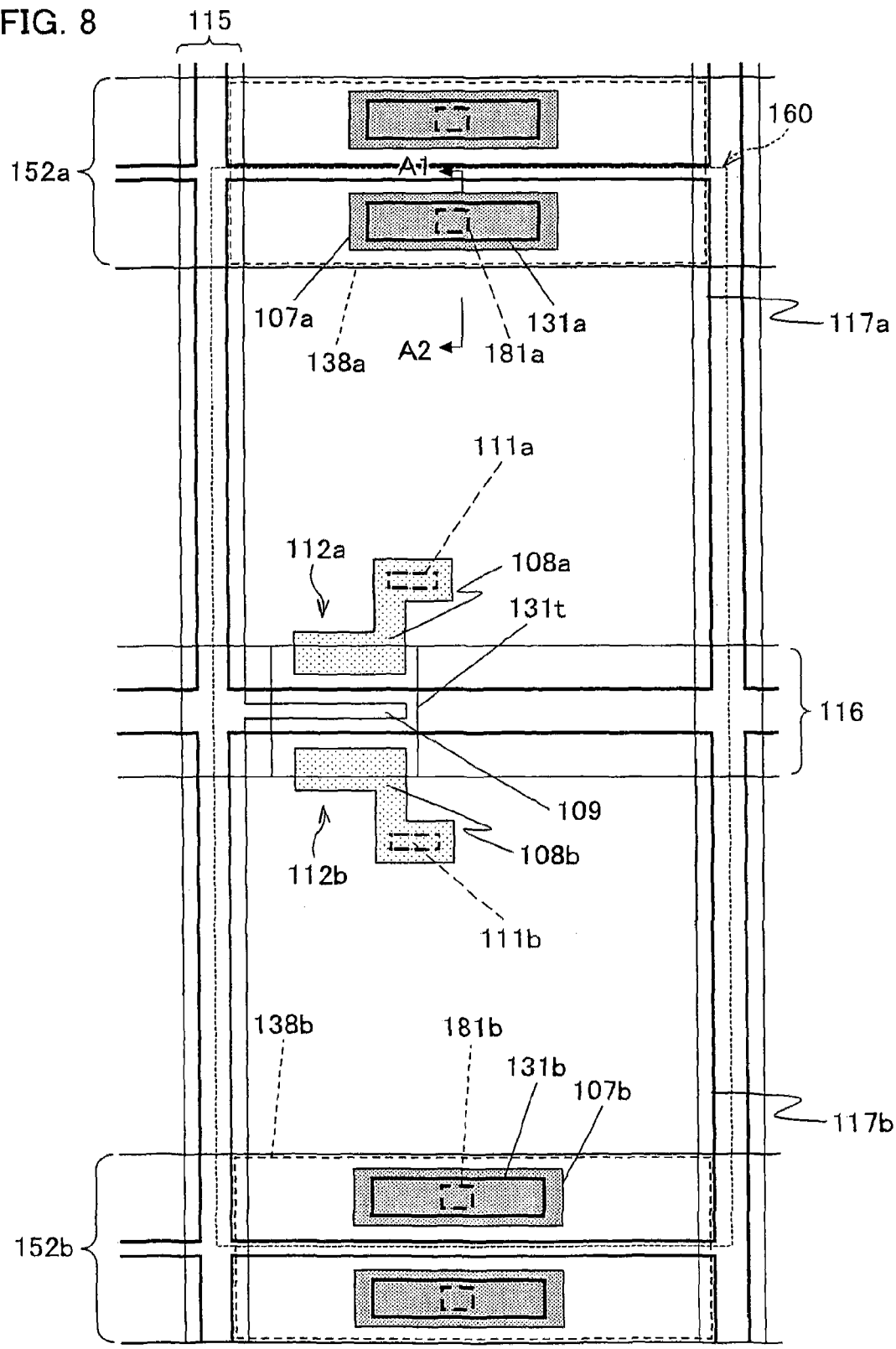
FIG. 8 is a plan view of the active matrix substrate of Embodiment 2.

Also, as shown in FIG. 8, the active matrix substrate of the present embodiment may not have the first drain lead line 147a shown in FIG. 5, when a contact hole 11a connecting the first drain electrode 108a with the first pixel electrode 117a and a contact hole 181a connecting the first pixel electrode 117a with the first drain lead electrode 107a are formed. The aperture is improved as much as the missing first drain lead line.

Figure 10:
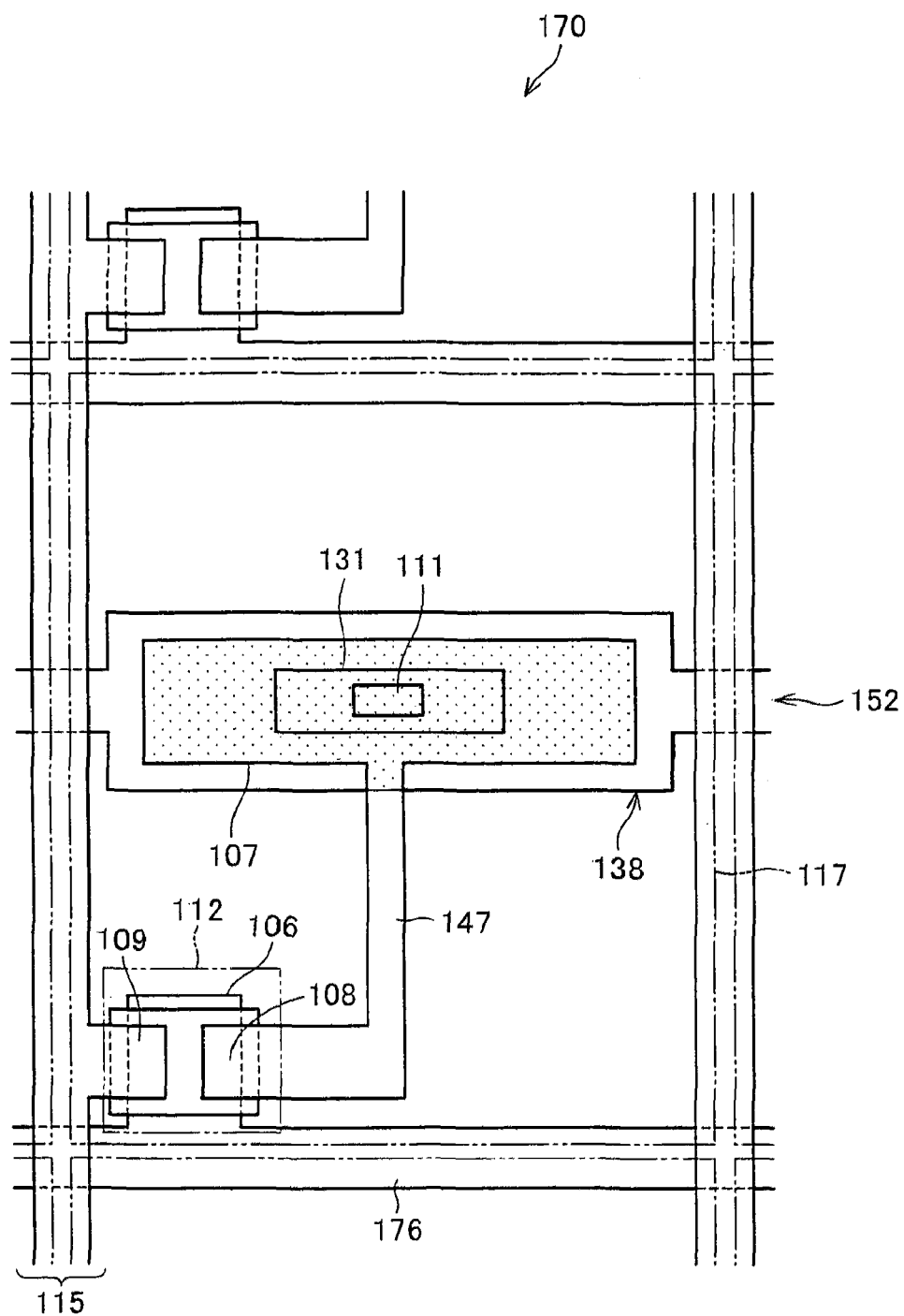
FIG. 10 is a plan view of the active matrix substrate of Embodiment 2.

The active matrix substrate of the present embodiment may be arranged as shown in FIG. 10. The active matrix substrate shown in FIG. 10 is arranged such that each pixel area 170 is provided with a TFT 112, a pixel electrode 117, a connected electrode 107, and a contact hole 111. The present active matrix substrate is provided with a scanning signal line 176 extending in the horizontal direction in the figure and a data signal line 115 extending in the vertical direction in the figure, which are arranged to be perpendicular to each other. The present active matrix substrate is further provided with a storage capacity wire 152 which is provided at the center of the pixel area 170 and extends in the horizontal direction in the figure.

The TFT 112 is provided with a source electrode 109 and a drain electrode 108, and its gate electrode 106 is an extension of the scanning signal line 176. The source electrode 109 is connected to the data signal line 115, whereas the drain electrode 108 is connected to the pixel electrode 117 through the contact hole 111. The pixel electrode 117 is a transparent electrode made of ITO or the like, and allows light (backlight beam) coming from below the present active matrix substrate to pass through.

The storage capacity wire 152 overlaps the drain lead electrode 107. The drain lead electrode 107 functions as an electrode of a capacity c, whereas the storage capacity wire 152 functions as the other electrode of the capacity c. This capacity c also functions as a storage capacitor.

In the present active matrix substrate, data (signal potential) from the data signal line 115 is supplied to the pixel electrode 117 via the source electrode 109 and the drain electrode 108 of the TFT 112.

The present active matrix substrate is provided with a gate insulating film which covers the scanning signal line (gate electrode of each transistor) and the storage capacity wire. Because of this, the gate insulating film has, on the pixel area 170, an on-conductor area 138 which overlaps the storage capacity wire 152.

In the present embodiment, a thin section 131 with reduced thickness is formed in the on-conductor area 138 of the gate insulating film. The gate insulating film has plural gate insulating layers. The thin section 131 is formed by partly removing or thinning at least one of the gate insulating layers. More specifically, the thin section 131 has a horizontally-long rectangular shape and is locally formed around the center of the on-conductor area 138.

Also in the arrangement shown in FIG. 10, since the entirety of the thin section 131 is formed in the on-conductor area of the gate insulating film, the storage capacity wire 152 has error tolerance with respect to the thin section 131. Therefore a capacitance value of the storage capacitor c scarcely changes even if the line width of the storage capacity wire 152 is inconsistent or misalignment occurs, on condition that an edge of the capacity c overlaps the thin section 331.

Furthermore, the thin section 131 is provided in the area where the gate insulating film overlaps the drain lead electrode 107 (i.e. the entirety of the thin section 131 overlaps the drain lead electrode 107). Therefore the connected electrode 107 has error tolerance with respect to the thin section 131. For this reason the capacity c scarcely changes even if the width of the drain lead electrode 107 is inconsistent or misalignment occurs, on condition that no edge of the capacity c overlaps the thin section 131.

Embodiment 3

Figure 22:
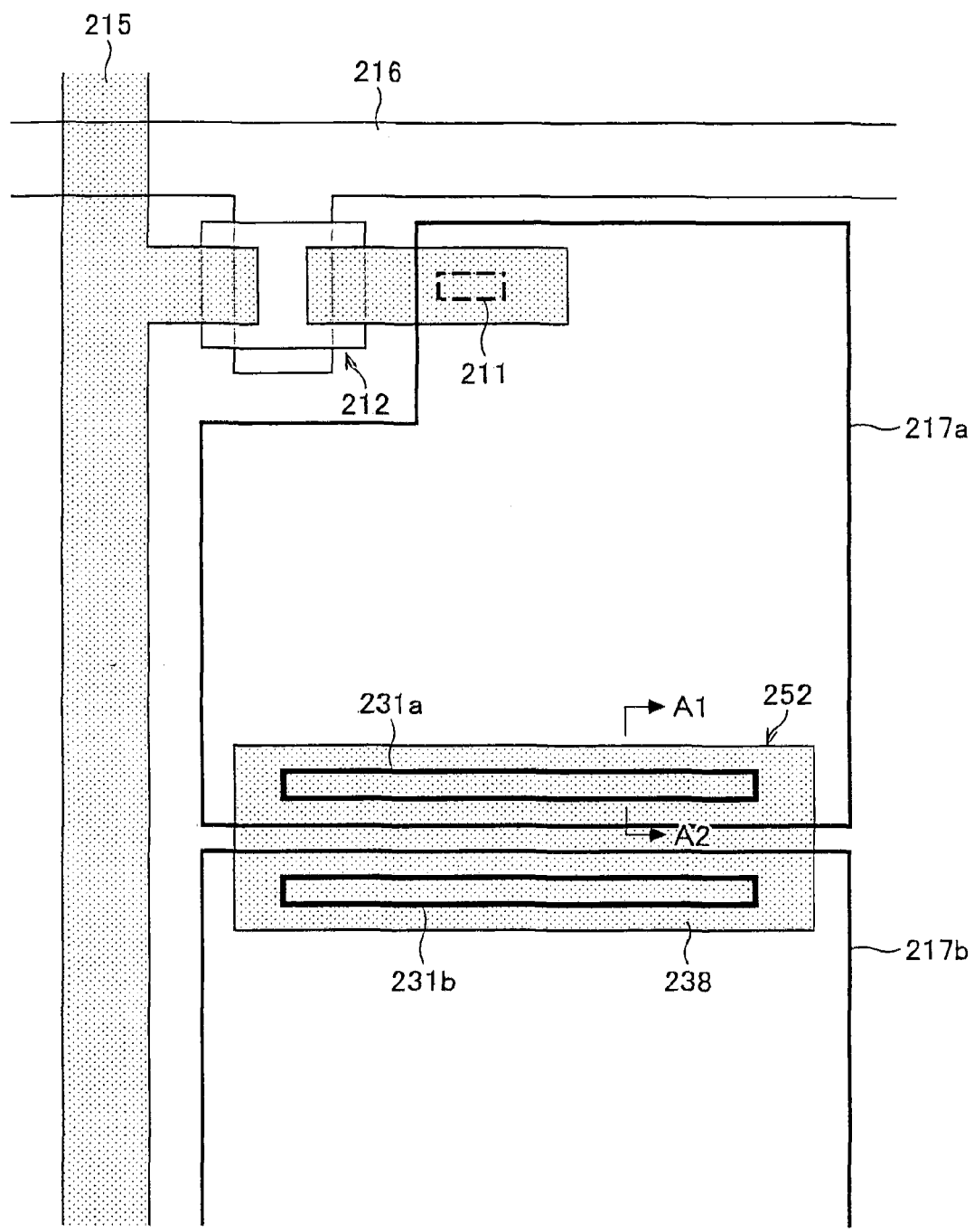
FIG. 22 is a plan view of an active matrix substrate of Embodiment 3.
Figure 23:
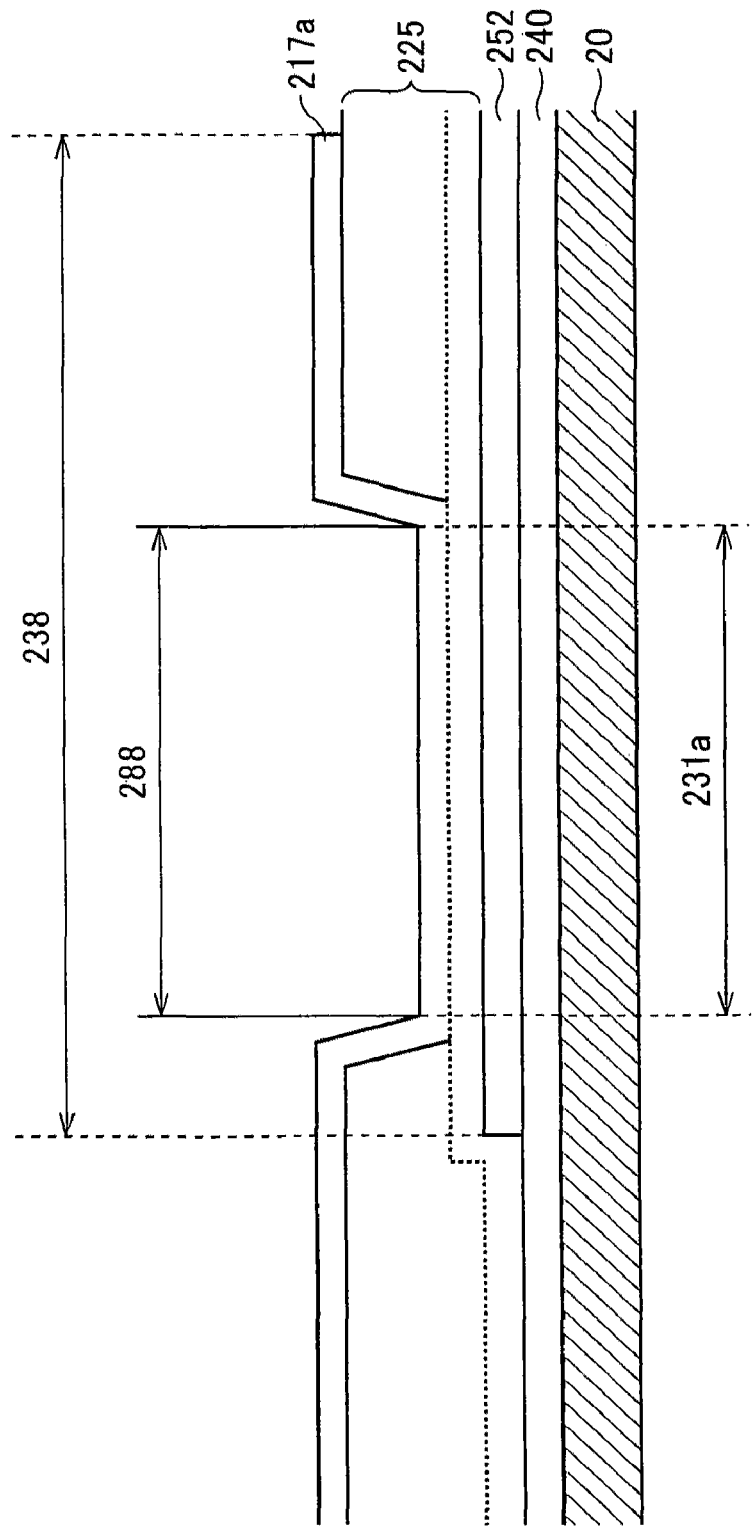
FIG. 23 is a cross section at A1-A2 line in FIG. 22.

The present active matrix substrate may be arranged as shown in FIG. 22. FIG. 23 is a cross section at A1-A2 in FIG. 22. As shown in FIG. 22, the present active matrix substrate includes, on each pixel area, a TFT 212, a first pixel electrode 217a and a second pixel electrode 217b (capacity electrodes), a contact hole 211, a control capacity electrode 252 (conductor), and a scanning signal line 216 extending in the horizontal direction in the figure and a data signal line 215 extending in the vertical direction in the figure, which arranged to be perpendicular to each other.

The control capacity electrode 252 has a rectangular shape which is long along the scanning signal line 216, and overlaps both of the first and second pixel electrodes. As a result of this, a capacity C1 formed by the first pixel electrode 217a and the control capacity electrode 252 is connected in series with a capacity C2 formed by the control capacity electrode 252 and the second pixel electrode 217b, and hence the first and second pixel electrodes 217a and 217b are capacitive coupled.

In the present active matrix substrate, as shown in FIG. 23, on the substrate 20 a gate insulating film 240 is formed and on the gate insulating film 240 a control capacity electrode 252 is formed. On this control capacity electrode 252, an interlayer insulating film 225 is formed to cover a channel section of a transistor 212 (see FIG. 22). This interlayer insulating film 225 therefore has, in each pixel area, an on-conductor area 238 (see FIG. 22) overlapping the control capacity electrode 252.

In the present embodiment, as shown in FIGS. 22 and 23, thin sections 231a and 231b with reduced thickness are formed in the on-conductor area 238 of the interlayer insulating film. The interlayer insulating film 225 has plural insulating layers. The thin sections 231a and 231b are formed by removing or thinning at least one of these insulating layers. More specifically, the thin section 231a has a horizontally-long rectangular shape, and is formed so that the entirety of the section 231a overlaps the control capacity electrode 252 and the first pixel electrode 217a.

Similarly, the thin section 231b has a horizontally-long rectangular shape, and is formed so that the entirety of the section 231b overlaps the control capacity electrode 252 and the second pixel electrode 217b. As a result the capacity C1 is predominantly determined by the area (288 in FIG. 23) where the first pixel electrode 217a, the control capacity electrode 252, and the thin section 231a overlap one another, and the capacity C2 is predominantly determined by the area where the second pixel electrode 217b, the control capacity electrode 252, and the thin section 231b overlap one another.

In the arrangement shown in FIG. 22, since the entirety of the thin section 231a is provided in the on-conductor area 238 of the interlayer insulating film, the control capacity electrode 252 has error tolerance with respect to the thin section 231a. Therefore a capacitance value of the capacity C1 scarcely changes even if the line width of the control capacity electrode 252 is inconsistent or misalignment occurs, on condition that no edge of the capacity C1 overlaps the thin section 231a. Also, a capacitance value of the capacity C1 scarcely changes even if the alignment or the like of the first pixel electrode 217a is inconsistent, on condition that no edge of the capacity C1 overlaps the thin section 231a.

Similarly, a capacitance value of the capacity C2 scarcely changes even if the line width of the control capacity electrode 252 is inconsistent or misalignment occurs, on condition that no edge of the capacity C2 overlaps the thin section 231b. Also, a capacitance value of the capacity C2 scarcely changes even if the alignment or the like of the second pixel electrode 217b is inconsistent, on condition that no edge of the capacity C2 overlaps the thin section 231b.

Figure 24:
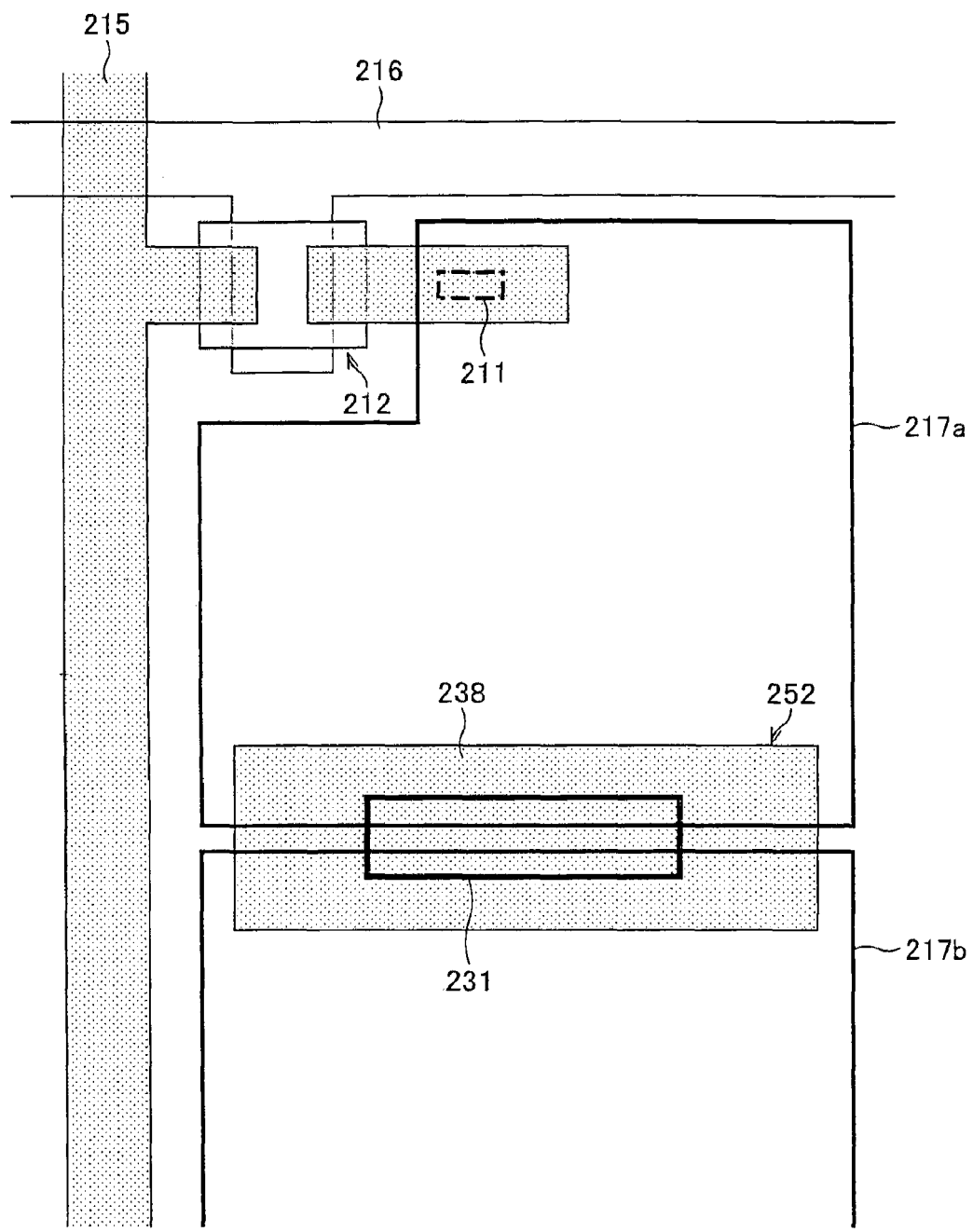
FIG. 24 is a plan view showing another example of the active matrix substrate of Embodiment 3.

The active matrix substrate shown in FIG. 22 may be modified in the manner as shown in FIG. 24. That is to say, in each pixel area, each thin section 231 may be provided at the central part of the on-conductor area 238 of the interlayer insulating film, in such a way that it overlaps the first and second pixel electrodes 217a and 217b.

Figure 11:
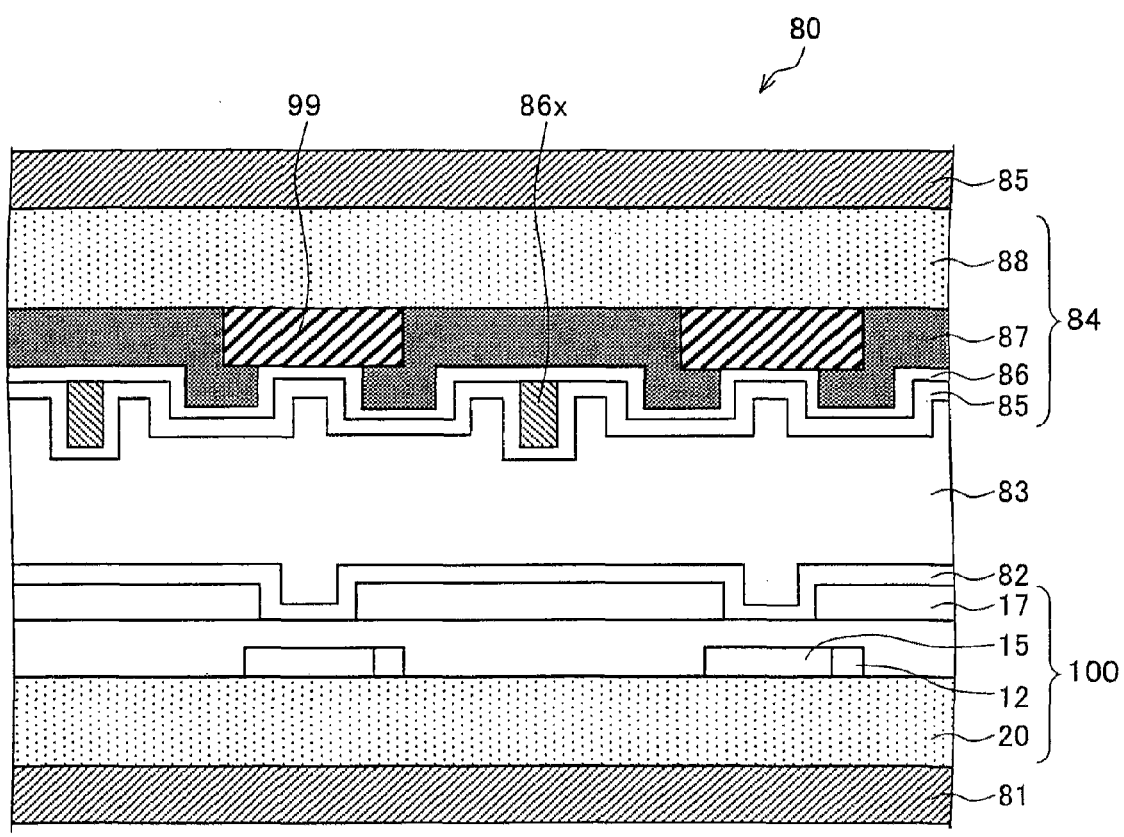
FIG. 11 is a cross section of a liquid crystal panel of the present embodiment.

FIG. 11 shows an arrangement when the present active matrix substrate is used in a liquid crystal panel. As shown in the figure, the present liquid crystal panel 80 includes, from the backlight light source side, a polarizing plate 81, the present active matrix substrate 100 (see FIG. 1, FIG. 5 and the like), an alignment film 82, a liquid crystal layer 83, a color filter substrate 84, and a polarizing plate 85. The color filter substrate 84 includes, from the liquid crystal layer 83 side, an alignment film 85, a common (opposing) electrode 86, colored layer 87 (including a black matrix 99), and a glass substrate 88. The common (opposing) electrode 86 is provided with liquid crystal molecule alignment control protrusions (rib) 86x. The liquid crystal molecule alignment control protrusions 86x are made of, for example, photosensitive resin or the like. The planar shape of the rib 86x (viewed in the direction perpendicular to the surface of the substrate) looks like, for example, a strip zigzagged at predetermined intervals (horizontal V shape).

Now, how liquid crystal is enclosed between an active matrix substrate and a color filter substrate when the active matrix substrate is used in a liquid crystal panel is discussed. To enclose liquid crystal, vacuum filling may be performed as follows: a filling hole is provided around the substrate for the purpose of feeding the liquid crystal, the filling hole is soaked into the liquid crystal in vacuum, the liquid crystal run through the hole in response to exposure to air, and then the filling hole is sealed by UV-curing resin or the like. However, in the case of a vertically-aligned liquid crystal panel, a liquid crystal dropping lamination method described below is preferable because time for injection is significantly long as compared to a horizontally-aligned panel. First, an UV curing sealing resin is applied to the surrounding area of the active matrix substrate, and liquid crystal is dropped onto the color filter substrate by a dropping method. By the liquid crystal dropping method, a liquid crystal droplet of an appropriate amount is regularly dropped onto the inside of the seal in such a way that the liquid crystal achieves a desired cell gap. Subsequently, to laminate the active matrix substrate onto the color filter substrate to which the seal drawing and the liquid crystal dropping have been carried out, an ambient atmosphere inside the lamination apparatus is reduced to 1 Pa, and the substrates are laminated under this reduced pressure. Thereafter, the air pressure is arranged to be atmospheric pressure so that the seal portion is crushed, with the result that a desired cell gap is obtained. Then the sealing resin is tentatively cured by UV light irradiation, and baking is carried out for the purpose of final curing of the sealing resin. At this point the liquid crystal is widespread inside the sealing resin and hence the cell is filled with the liquid crystal. After the baking, cutting is carried out so that panels are produced, and a polarizing plate is laminated onto the panel. In this way the liquid crystal panel shown in FIG. 11 is manufactured.

Now, the following will describe a liquid crystal display apparatus of the present embodiment.

Figure 12:
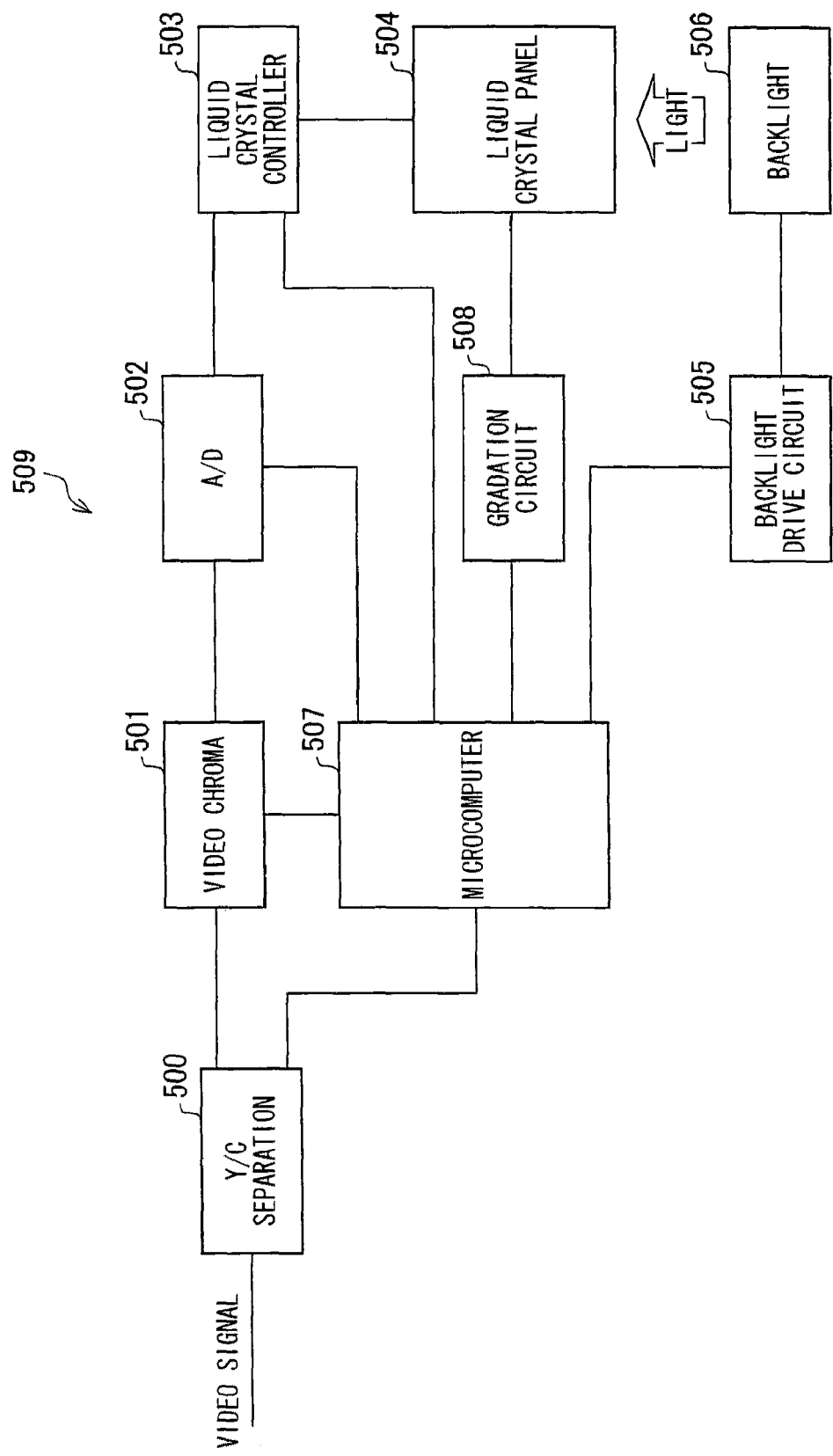
FIG. 12 is a block diagram showing an arrangement concerning the control of the liquid crystal panel of the present embodiment.

FIG. 12 is a block diagram showing the outline of the present liquid crystal display apparatus 509. As shown in FIG. 12, the liquid crystal display apparatus 509 includes a Y/C separation circuit 500, a video chroma circuit 501, an A/D converter 502, a liquid crystal controller 503, a liquid crystal panel 504 including the present active matrix substrate, a backlight drive circuit 505, a backlight 506, a microcomputer 507, and a gradation circuit 508.

An image signal and a video signal by which the liquid crystal display apparatus 509 performs display are supplied to the Y/C separation circuit 500, and each of them is separated into a brightness signal and a color signal. These brightness signal and color signal are converted by the video chroma circuit 501 into analog RGB signals corresponding to light's three primary colors R, G, and B, respectively. The analog RGB signals are further converted by the A/D converter 502 into digital RGB signals, and supplied to liquid crystal controller 503.

The digital RGB signals supplied to the liquid crystal controller 503 are supplied from the liquid crystal controller 503 to the liquid crystal panel 504. The liquid crystal panel 504 receives the digital RGB signals at predetermined timings from the liquid crystal controller 503, and also receives various grayscales voltages of each of R, G, and B from the gradation circuit 508. In the meanwhile the backlight drive circuit 505 drives the backlight 506 so that light is irradiated onto the liquid crystal panel 504. As a result the liquid-crystal panel 504 displays an image or video. Inclusive of the aforesaid steps, the overall control of the liquid crystal display apparatus 509 is carried out by the microcomputer 507.

There are various types of video signals, such as a video signal based on television broadcast, a video signal produced by a camera, and a video signal supplied over the Internet.

Figure 13:
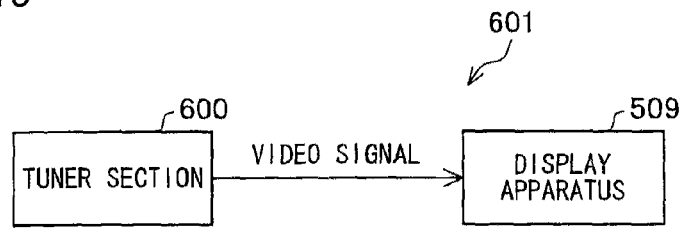
FIG. 13 is a black diagram showing a television receiver of the present embodiment.

As shown in FIG. 13, when the liquid crystal display apparatus 509 of the present invention is connected to a tuner section 600 which outputs a video signal in response to receipt of television broadcast, the liquid crystal display apparatus 509 can display a video (image) based on the video signal supplied from the tuner section 600. In this case, the liquid crystal display apparatus 509 and the tuner section 600 constitute a television receiver 601.

Figure 14:
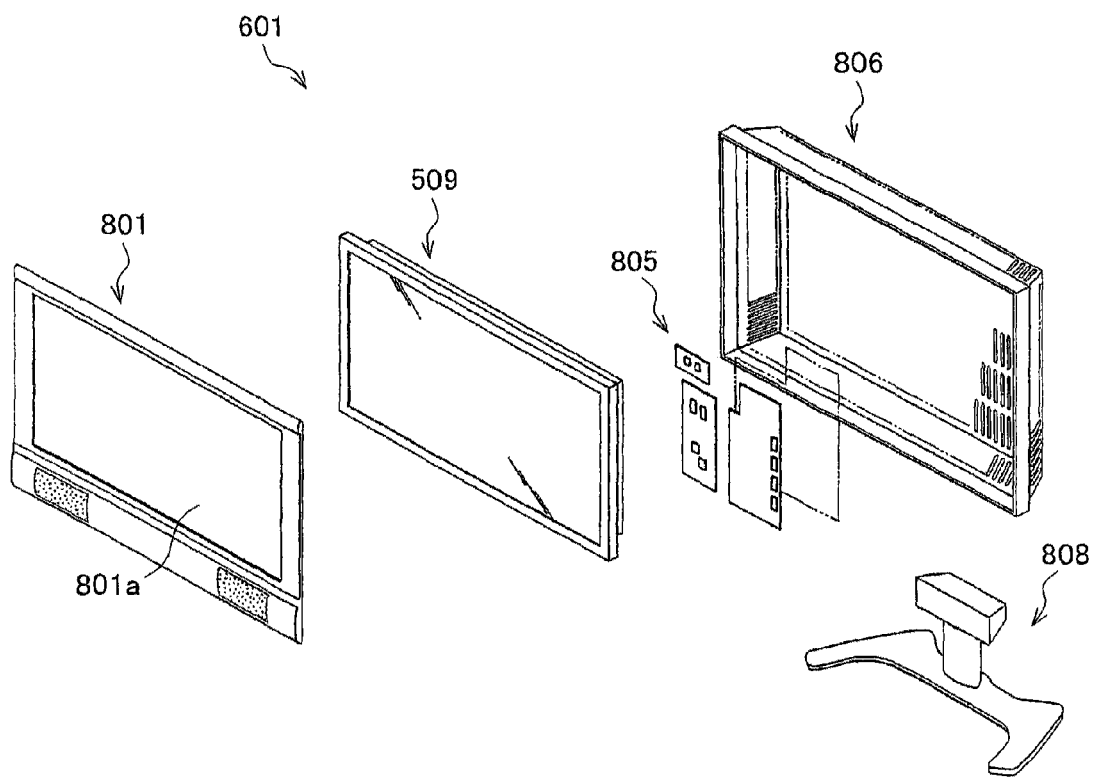
FIG. 14 is an oblique perspective view of the television receiver of the present embodiment.

In case where the liquid crystal display apparatus is used as a television receiver 601, for example, as shown in FIG. 14, the liquid crystal display apparatus 509 is sandwiched between a first housing 801 and a second housing 806. The first housing 801 is provided with an opening 801a that an image displayed by the liquid crystal display apparatus 509 passes through. The second housing 806 covers the back surface of the liquid crystal display apparatus. The second housing 806 is provided with an operation circuit 805 for operating the liquid crystal display apparatus 509, and a supporting member 808 is attached to the lower part of the housing 806.

Figure 15:
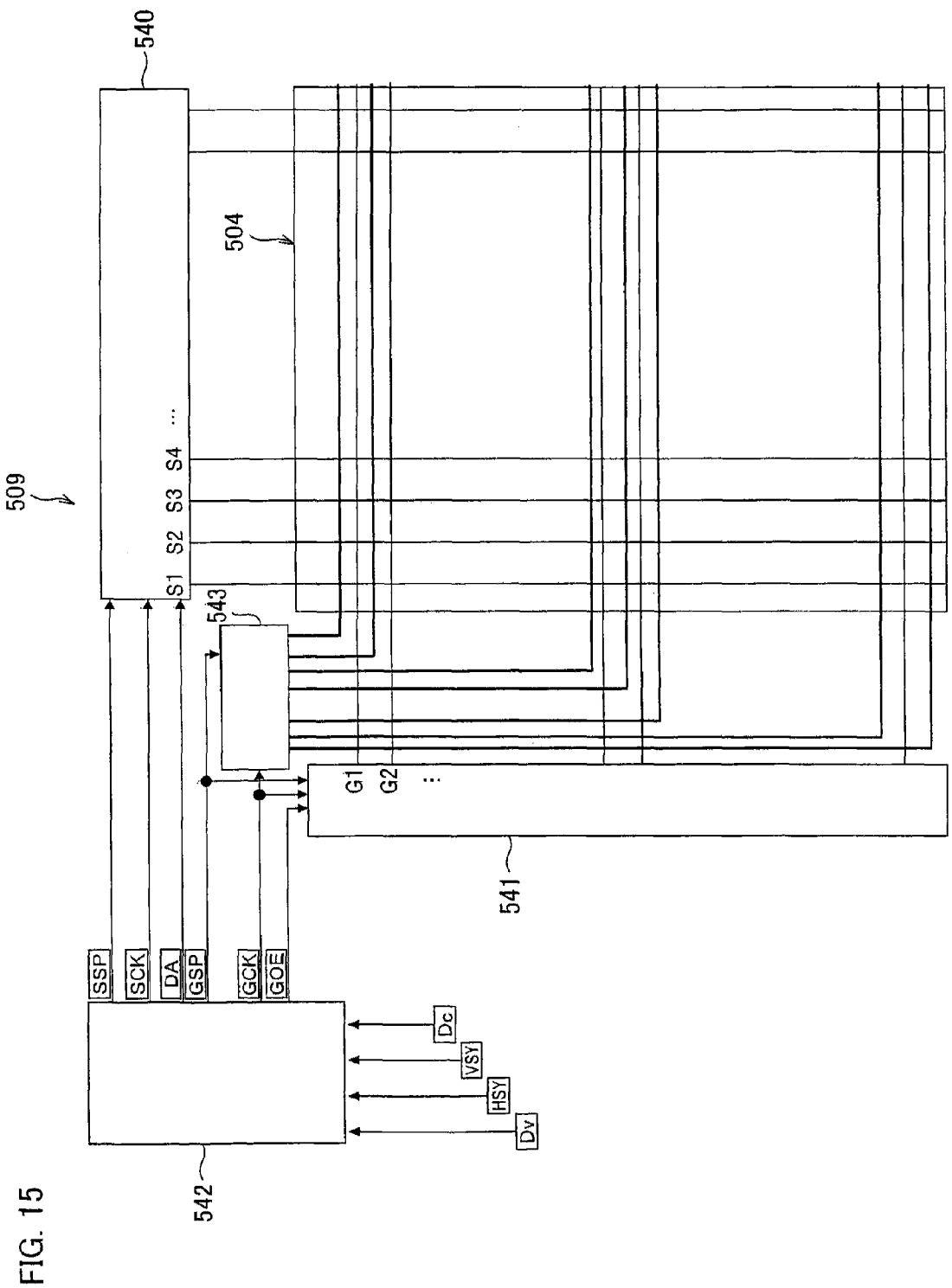
FIG. 15 is a block diagram showing an arrangement concerning the control of a liquid crystal display apparatus of the present embodiment.

Now, the following provides an example of the present liquid crystal display apparatus performing multi-pixel drive (i.e. having an active matrix substrate for multi-pixel drive). FIG. 15 is a schematic of this liquid crystal display apparatus.

The liquid crystal display apparatus 509 includes a liquid crystal panel 504, a source driver 540 (data signal line drive circuit) driving source lines S1 . . . , a gate driver 541 (scanning signal line drive circuit) driving gate lines G1 . . . , a Cs control circuit 543 driving storage capacity wires (signal lines) Cs1 . . . , and a display control circuit 542 which controls the source driver 540, the gate driver 541, and the Cs control circuit 543.

Figure 16:
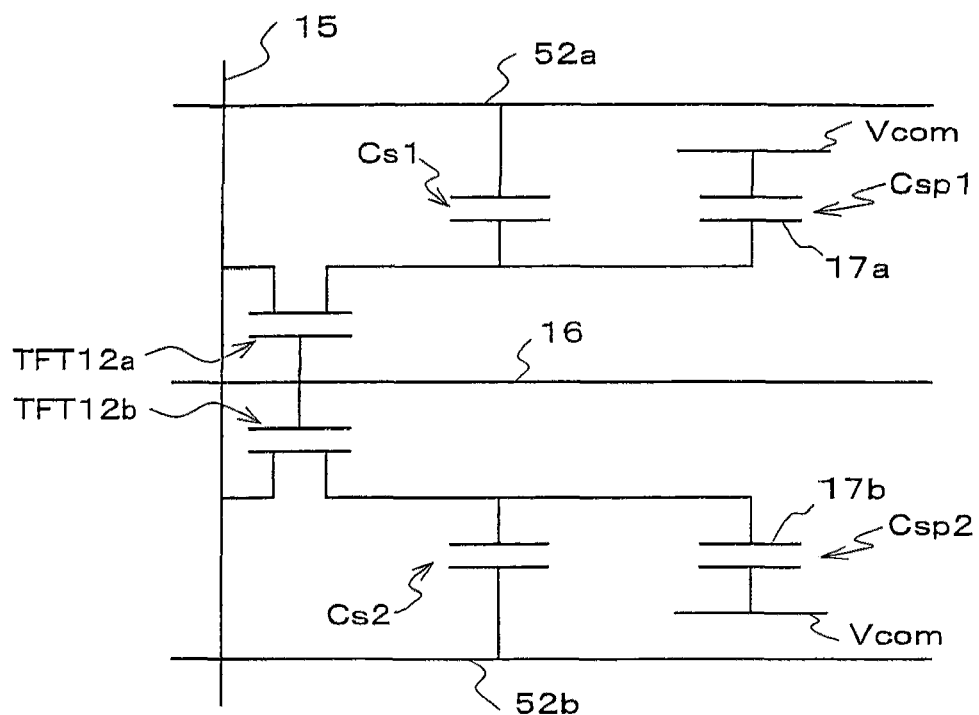
FIG. 16 is an equivalent circuit diagram of the present active matrix substrate.
Figure 17:
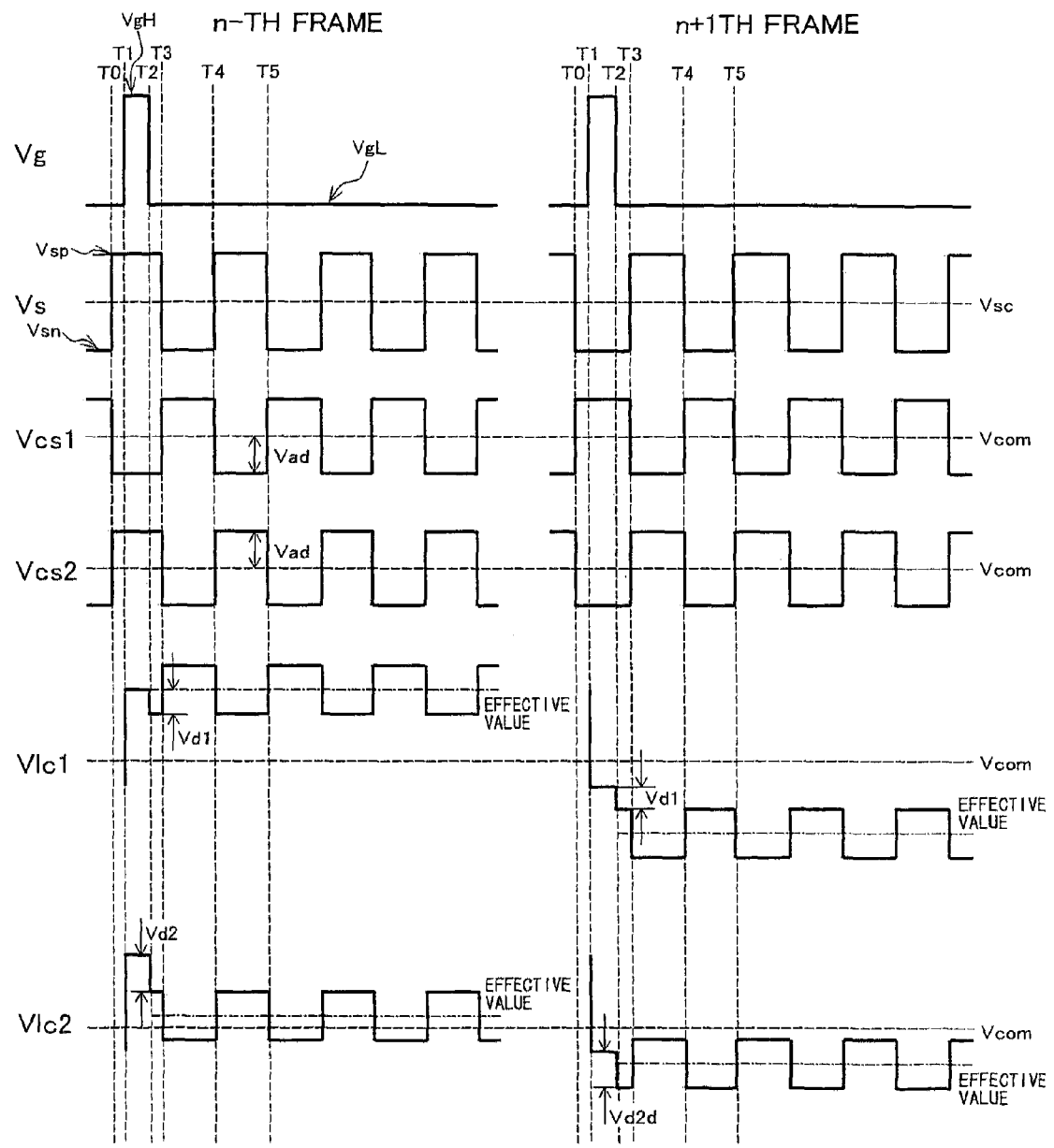
FIG. 17 is a timing chart showing a driving method of the present liquid crystal display apparatus.

The liquid crystal panel 504 is arranged as shown in FIG. 11 (for the active matrix substrate, see also FIG. 1, FIG. 5, etc.). As shown in FIGS. 16 and 17, a first pixel electrode 17a, an opposing electrode (Vcom), and a liquid crystal layer therebetween constitute first auxiliary pixel capacity Csp1, whereas a second pixel electrode 17b, an opposing electrode (Vcom), and a liquid crystal layer therebetween constitute a second auxiliary capacity Csp2. In the present liquid crystal display apparatus 509, a polarizing plate is provided so that normally black is achieved.

From an external signal source, the display control circuit 542 receives a digital video signal Dv representing an image to be displayed, a horizontal synchronization signal HSY and a vertical synchronization signal VSY both corresponding to the digital video signal Dv, and a control signal Dc for controlling display operations. Based on the signals Dv, HSY, VSY, and Dc, the circuit 542 generates and outputs, as signals for causing the liquid crystal panel 504 to display the image represented by the digital video signal Dv, a data start pulse signal SSP, a data clock signal SCK, a digital image signal DA representing the image to be displayed, a gate start pulse signal GSP, a gate clock signal GCK, and a gate driver output control signal GOE.

More specifically, after timing adjustment or the like of a video signal Dv in an internal memory is carried out as need arises, the video signal Dv is output as a digital image signal DA from the display control circuit 542. As a signal constituted by pulses corresponding to respective pixels by which the image represented by the digital image signal DA is to be displayed, a data clock signal SCK is generated. Based on a horizontal synchronization signal HSY, a data start pulse signal SSP is generated as a signal which is kept at high level (H level) for a predetermined period of time in each horizontal scanning period. Based on a vertical synchronization signal VSY, a gate start pulse signal GSP is generated as a signal which is kept at H level for a predetermined period of time in one frame period (one vertical scanning period). Based on the horizontal synchronization signal HSY, a gate clock signal GCK is generated. Based on the horizontal synchronization signal HSY and the control signal Dc a gate driver output control signal GOE is generated.

Among these signals generated by the display control circuit 542, the digital image signal DA, the data start pulse signal SSP, and the data clock signal SCK are supplied to the source driver 540, whereas the gate start pulse signal GSP, the gate clock signal GCK, and the gate driver output control signal GOE are supplied to the gate driver 541.

The source driver 540 serially generates, based on the digital image signal DA, the data start pulse signal SSP, and the data clock signal SCK, data signals in respective horizontal scanning periods, as analog voltages corresponding to pixel values, on each horizontal scanning signal line, of the image represented by the digital image signal DA, and applies the data signals to the source lines S.

The Cs control circuit 543 receives the GCK and GSP. The Cs control circuit 542 controls the phase and width of a Cs signal waveform.

Now, referring to FIG. 16 through FIG. 17, FIG. 1, FIG. 5, and the like, an example of a drive (multi-pixel drive) method of the present liquid crystal display apparatus 509 will be discussed.

In the present embodiment, to the first pixel electrode 17a and the second pixel electrode 17b, a display signal voltage is supplied from a common data signal line in advance. After the TFTs 12a and 12b are turned off, the first storage capacity wire 52a and the second storage capacity wire 52b are arranged to have different voltages. As a result of this, in each pixel a high-brightness area by means of the first auxiliary pixel capacity Csp1 and a low-brightness area by means of the second auxiliary capacity Csp2 are formed. In the present arrangement two pixel electrodes receive a display signal voltage from a single data signal line. This is advantageous in that it is unnecessary to increase the number of data signal lines and the number of source drivers driving thereof.

FIG. 17 is a timing chart showing voltages at respective parts of the circuit shown in FIG. 16. Vg indicates a voltage on the scanning signal line (gate electrode of the first and second TFTs), Vs indicates a voltage on the data signal line (i.e. source voltage), Vcs1 indicates a voltage on the first storage capacity wire, Vcs2 indicates a voltage on the second storage capacity wire, Vlc1 indicates a voltage on the first pixel electrode, and Vlc2 indicates a voltage on the first pixel electrode. In a liquid crystal display apparatus, AC drive such as frame inversion, line inversion, and dot inversion is typically carried out for the purpose of preventing liquid crystal from being polarized. That is, a source voltage (Vsp) which is positive with respect to the median Vsc of the source voltage is applied in an n-th frame, a source voltage (Vsn) which is negative with respect to the Vsc is applied in the next (n+1)th frame, and dot inversion is also carried out in each frame. A voltage on the first storage capacity wire and a voltage on the second storage capacity wire are arranged to oscillate with an amplitude voltage Vad, while the phases of these voltages are arranged to be different for 180°.

The following will show changes over time of the voltage waveforms in an n-th frame.

First, at a time point T0, Vcs1=Vcom−Vad and Vcs2=Vcom+Vad hold true. Vcom indicates a voltage on the opposing electrode.

At a time point T1, Vg changes from VgL to VgH, and each TFT is turned on. As a result Vlc1 and Vlc2 increase to Vsp, so that the storage capacities Cs1 and Cs2 and auxiliary pixel capacities Csp1 and Csp2 are charged.

At a time point T2, Vg changes from VgH to VgL so that each TFT is turned off, with the result that the storage capacities Cs1 and Cs2 and the auxiliary pixel capacities Csp1 and Csp2 are electrically insulated from the data signal line. Immediately after this, voltage drawing occurs due to an influence of a parasitic capacity or the like, with the result that Vlc1=Vsp−Vd1 and Vlc2=Vsp−Vd2 hold true.

At a time point T3, Vcs1 changes from Vcom−Vad to Vcom+Vad and Vcs2 changes from Vcom+Vad to Vcom−Vad. As a result Vlc1=Vsp−Vd1+2×K×Vad and Vlc2=Vsp−Vd2−2×K×Vad hold true. At this stage K=Ccs/(Clc+Ccs) holds true. Ccs indicates a capacitance value of each of the storage capacities (Cs1 and Cs2), and Clc indicates a capacitance value of each of the auxiliary pixel capacities (Csp1 and Csp2).

At a time point T4, Vcs1 changes from Vcom+Vad to Vcom−Vad, and Vcs2 changes from Vcom−Vad to Vcom+Vad. As a result Vlc1=Vsp−Vd1 and Vlc2=Vsp−Vd2 hold true.

At a time point T5, Vcs1 changes from Vcom−Vad to Vcom+Vad, and Vcs2 changes from Vcom+Vad to Vcom−Vad. As a result Vlc1=Vsp−Vd1+2×K×Vad and Vlc2=Vsp−Vd2−2×K×Vad hold true.

Thereafter, until Vg=Vgh becomes to hold true and writing is carried out, the operations at the time points T4 and T5 are repeated each time a period which is an integral multiple of a horizontal scanning period 1H elapses. Therefore an effective of Vlc1 is Vsp−Vd1+K×Vad and an effective value of Vlc2 is Vsp−Vd2−K×Vad.

Because of the above, the effective voltages (V1 and V2) on the respective auxiliary pixel capacities (first auxiliary pixel capacity Csp1 and second auxiliary capacity Csp2) in the n-th frame are V1=Vsp−Vd1+K×Vad−Vcom and V2=Vsp−Vd2−K×Vad−Vcom. Therefore, in each pixel, a high-brightness area by means of the first auxiliary pixel capacity Csp1 and a low-brightness area by means of the second auxiliary capacity Csp2 are formed.

Now, the following will show changes over time of the respective voltage waveforms in the (n+1)th frame.

First, at a time point T0, Vcs1=Vcom+Vad and Vcs2=Vcom−Vad hold true. Vcom indicates a voltage on the opposing electrode.

At a time point T1, Vg changes from VgL to VgH, and each TFT is turned on. As a result Vlc1 and Vlc2 decrease to Vsn, so that the storage capacities Cs1 and Cs2 and auxiliary pixel capacities Csp1 and Csp2 are charged.

At a time point T2, Vg changes from VgH to VgL so that each TFT is turned off, with the result that the storage capacities Cs1 and Cs2 and the auxiliary pixel capacities Csp1 and Csp2 are electrically insulated from the data signal line. Immediately after this, voltage drawing occurs due to an influence of a parasitic capacity or the like, with the result that Vlc1=Vsn−Vd1 and Vlc2=Vsn−Vd2 hold true.

At a time point T3, Vcs1 changes from Vcom+Vad to Vcom−Vad and Vcs2 changes from Vcom−Vad to Vcom+Vad. As a result Vlc1=Vsn−Vd1−2×K×Vad and Vlc2=Vsn−Vd2+2×K×Vad hold true. At this stage K=Ccs/(Clc+Ccs) holds true. Ccs indicates a capacitance value of each of the storage capacities (Cs1 and Cs2), and Clc indicates a capacitance value of each of the auxiliary pixel capacities (Csp1 and Csp2).

At a time point T4, Vcs1 changes from Vcom−Vad to Vcom+Vad and Vcs2 changes from Vcom+Vad to Vcom−Vad. As a result Vlc1=Vsn+Vd1 and Vlc2=Vsn+Vd2 hold true.

At a time point T5, Vcs1 changes from Vcom+Vad to Vcom−Vad and Vcs2 changes from Vcom−Vad to Vcom+Vad. As a result Vlc1=Vsn−Vd1−2×K×Vad and Vlc2=Vsn−Vd2+2×K×Vad hold true.

Thereafter, until Vg=Vgh becomes to hold true and writing is carried out, the operations at the time points T4 and T5 are repeated each time a period which is an integral multiple of a horizontal scanning period 1H elapses. Therefore an effective of Vlc1 is Vsn−Vd1−K×Vad and an effective value of Vlc2 is Vsn−Vd2+K×Vad.

Because of the above, the effective voltages (V1 and V2) on the respective auxiliary pixel capacities (Csp1 and Csp2) in the (n+1)th frame are V1=Vsn−Vd1−K×Vad−Vcom and V2=Vsn−Vd2+K×Vad−Vcom. Therefore, in each pixel, a high-brightness area by means of the first auxiliary pixel capacity Csp1 and a low-brightness area by means of the second auxiliary capacity Csp2 are formed.

A large-sized active matrix substrate has a problem such that exposure areas (display areas) corresponding to respective exposure steps are different in brightness because exposure amounts are different among the exposure steps (i.e. the values if aforesaid K are different within the substrate because of inconsistency in the line widths of resist patterns or misalignment). The present active matrix substrate makes it possible to effectively restrain the inconsistent of K within the substrate, and hence the aforesaid problem is solved.

In the method above, the phases of Vcs1 and Vcs2 are arranged to be different for 180° for the sake of simplicity. However, the difference is not necessarily 180° on condition that a bright area and a dark area are formed in each pixel. Also, although the description above assumes that the pulse width of Vcs1 and the pulse width of Vcs2 are both Vs, the pulse widths are preferably adjusted suitably in consideration of, for example, insufficient charging of the storage capacitor due to Cs signal delay at the time of driving a large-sized high-definition liquid crystal display. The widths are controllable by the Cs control circuit that receives GSP and GCK.

Figure 18:
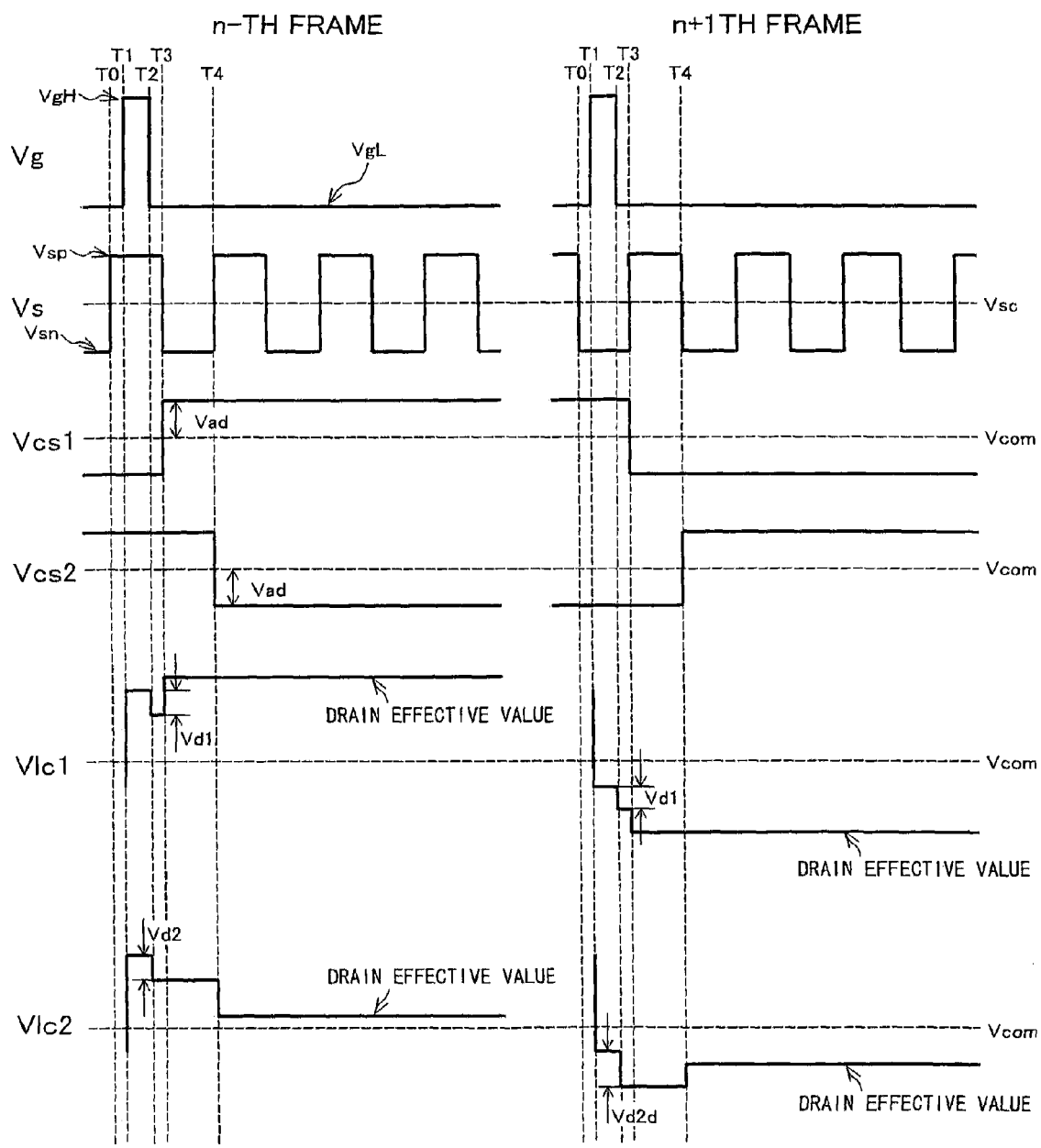
FIG. 18 is a timing chart showing another driving method of the present liquid crystal display apparatus.

Alternatively, as shown in FIG. 18, Vcs1 is arranged to have an waveform such that the signal is kept at High (or Low) in T3 immediately after T2 at which Vg is changed to L (i.e. each of the TFTs 12a and 12b is turned off), and Vcs2 is arranged such that the signal is kept at Low (or High) at T4 which is the time point after one horizontal period (1H) elapses from T3. That is to say, potential control is performed in such a manner that, after each transistor is turned off, Vcs1 is changed to high level and this state of high level is maintained in that frame and Vcs2 is changed to low level after 1H elapses from the change to high level of Vcs1 and this state of low level is maintained in that frame. Alternatively, potential control is performed in such a manner that, after each transistor is turned off, Vcs1 is changed to low level and this state of low level is maintained in that frame, and Vcs2 is changed to high level after 1H elapses from the change to high level of Vcs1 and this state of high level is maintained in that frame.

The following shows changes over time of voltage waveforms in an n-th frame shown in FIG. 18.

First, at a time point T0, Vcs1=Vcom−Vad and Vcs2=Vcom+Vad hold true. Vcom indicates a voltage on the opposing electrode.

At a time point T1, Vg changes from VgL to VgH, and each TFT is turned on. As a result Vlc1 and Vlc2 increase to Vsp, so that the storage capacities Cs1 and Cs2 and auxiliary pixel capacities Csp1 and Csp2 are charged.

At a time point T2, Vg changes from VgH to VgL so that each TFT is turned off, with the result that the storage capacities Cs1 and Cs2 and the auxiliary pixel capacities Csp1 and Csp2 are electrically insulated from the data signal line. Immediately after this, voltage drawing occurs due to an influence of a parasitic capacity or the like, with the result that Vlc1=Vsp−Vd1 and Vlc2=Vsp−Vd2 hold true.

At a time point T3, Vcs1 changes from Vcom−Vad to Vcom+Vad. At a time point T4 (1h elapses after T3), Vcs2 changes from Vcom+Vad to Vcom−Vad. As a result Vlc1=Vsp−Vd1+2×K×Vad and Vlc2=Vsp−Vd2−2×K×Vad hold true. At this stage K=Ccs/(Clc+Ccs) holds true. Ccs indicates a capacitance value of each of the storage capacities (Cs1 and Cs2), and Clc indicates a capacitance value of each of the auxiliary pixel capacities (Csp1 and Csp2).

Because of the above, the effective voltages (V1 and V2) on the respective auxiliary pixel capacities (first auxiliary pixel capacity Csp1 and second auxiliary capacity Csp2) in the n-th frame are V1=Vsp−Vd1+2×K×Vad−Vcom and V2=Vsp−Vd2−2×K×Vad−Vcom. Therefore, in each pixel, a bright auxiliary pixel by means of the first auxiliary pixel capacity Csp1 and a dark auxiliary pixel by means of the second auxiliary capacity Csp2 are formed.

This arrangement reduces an influence of blunting of the waveforms of Vcs1 and Vcs2 on a drain effective potential, and hence the arrangement is effective for the reduction of brightness inconsistency.

Figure 29:
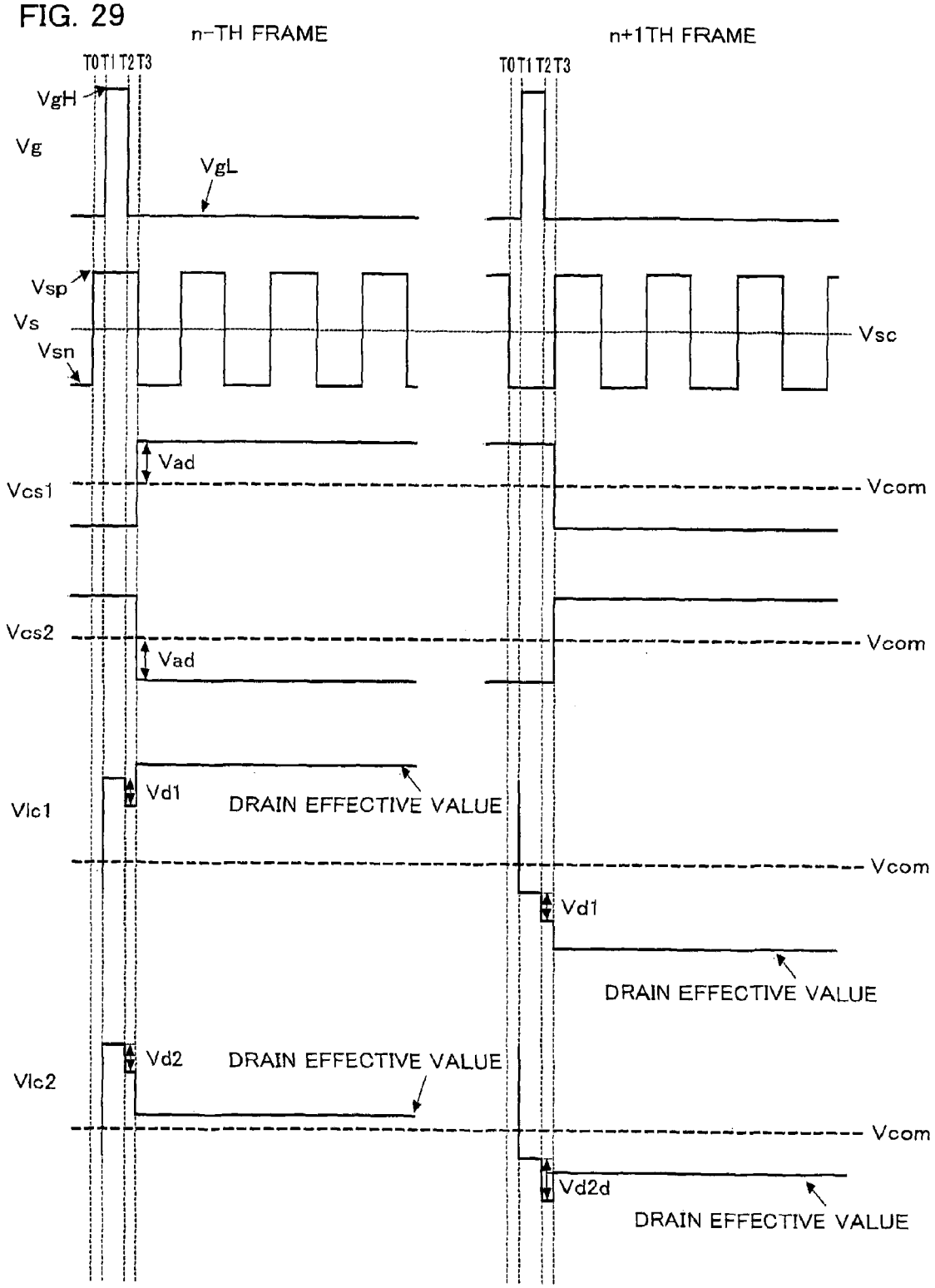
FIG. 29 is a timing chart showing another driving method of the present liquid crystal display apparatus.
Figure 30:
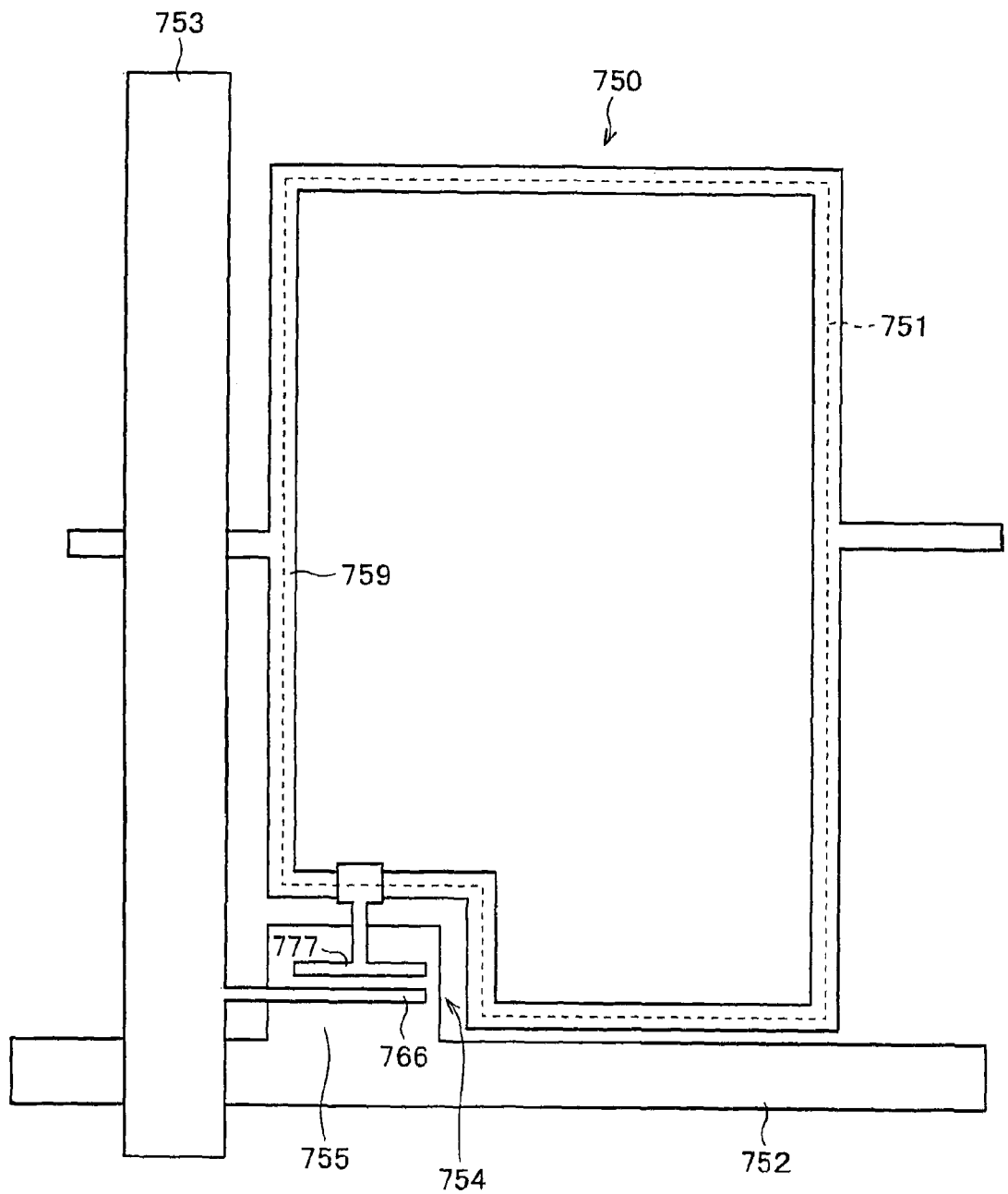
FIG. 30 is a plan view of a conventional active matrix substrate.
Figure 31:
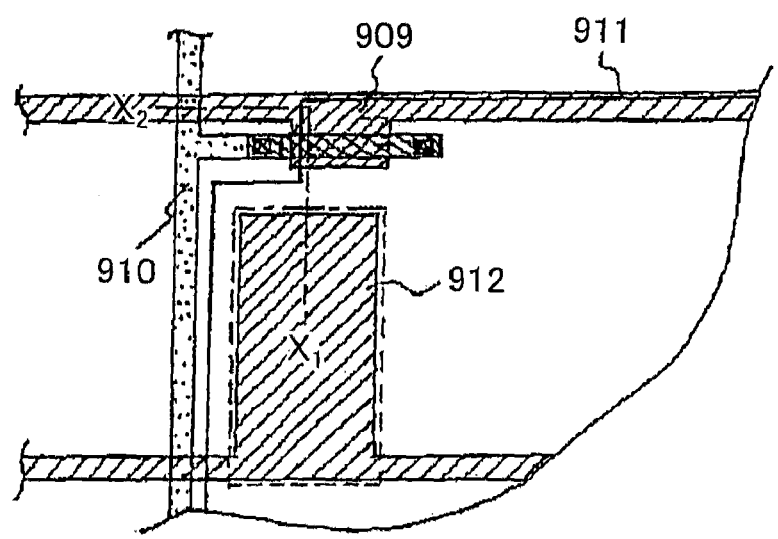
FIG. 31(a) is a plan view of the conventional active matrix substrate.
FIG. 31(b) is a cross section of the active matrix substrate shown in FIG. 31(a).
Figure 31:
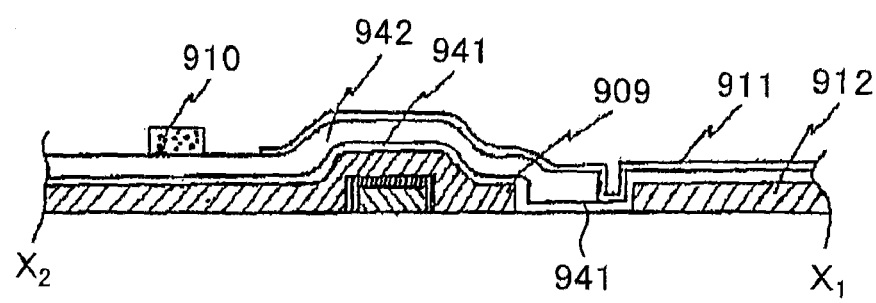

The active matrix substrates shown in FIG. 1, FIG. 3, FIG. 5, and FIG. 8 are arranged so that each storage capacity wire is shared by pixels which are vertically adjacent (along the data signal line). In an arrangement in which each storage capacity wire is not shared by vertically-adjacent pixels, as shown in FIG. 29, Vcs1 is arranged to have an waveform such that the signal is kept at High (or Low) in T3 immediately after T2 at which Vg is changed to L (i.e. each of the TFTs 12a and 12b is turned off), and similarly Vcs2 is arranged such that the signal is kept at Low (or High) at T3 which is the time point immediately after Vg is changed to L at T2. That is to say, potential control may be performed in such a manner that, after each transistor is turned off, Vcs1 is changed to high level and this state of high level is maintained in that frame and Vcs2 is changed to low level in sync with the change to high level of Vcs1 and this state of low level is maintained in that frame. Alternatively, potential control may be performed in such a manner that, after each transistor is turned off, Vcs1 is changed to low level and this state of low level is maintained in that frame, and Vcs2 is changed to high level in sync with the change to low level of Vcs1 and this state of high level is maintained in that frame.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The active matrix substrates of the present invention are suitable for, for example, liquid crystal television receivers.

The invention claimed is:

1. An active matrix substrate comprising:
a transistor;
a pixel electrode electrically connected to the transistor;
a conductor provided in a layer below the pixel electrode and an insulating film interposed between at least the pixel electrode and the conductor, the pixel electrode overlapping the conductor;
wherein the insulating film comprises a thin section and a non-thin section which is thicker than the thin section;
wherein the pixel electrode includes (a) a part overlapping the thin section and the conductor, and (b) a part overlapping the non-thin section and the conductor, and wherein no other electrode is located between the pixel electrode and the conductor in the area where the pixel electrode overlaps the thin section;
wherein (i) the thin section includes a part of a gate insulating film and a part of a channel protection film that contact with each other, and (ii) the non-thin section includes another part of said gate insulating film and another part of said channel protection film that contact with each other, and (iii) said gate insulating film covers a gate electrode of the transistor, and (iv) said channel protection film covers a channel of the transistor, and wherein said gate insulating film that is present in both the non-thin section and the thin section is also provided in the transistor between at least the gate electrode and a drain electrode of the transistor; and
wherein the thin section is formed so that the non-thin section surrounds the thin section.

2. An active matrix substrate comprising:
a transistor;
a pixel electrode electrically connected to the transistor;
a conductor provided in a layer below the pixel electrode and an insulating film interposed between at least the pixel electrode and the conductor, the pixel electrode overlapping the conductor;
wherein the insulating film comprises a thin section and a non-thin section which is thicker than the thin section;
wherein the pixel electrode includes (a) a part overlapping the thin section and the conductor, and (b) a part overlapping the non-thin section and the conductor;
wherein (i) the thin section includes a part of a gate insulating film and a part of a channel protection film that contact with each other, and (ii) the non-thin section includes another part of said gate insulating film and another part of said channel protection film that contact with each other, and (iii) said gate insulating film covers a gate electrode of the transistor, and (iv) said channel protection film covers a channel of the transistor, and wherein said gate insulating film that is present in both the non-thin section and the thin section is also provided in the transistor between at least the gate electrode and a drain electrode of the transistor;
wherein the pixel electrode overlaps the entirety of the thin section; and
wherein the conductor is a storage capacity wiring not proximate a gate of the transistor.

3. An active matrix substrate comprising:
a transistor;
a pixel electrode electrically connected to the transistor;
a conductor provided in a layer below the pixel electrode and an insulating film interposed between at least the pixel electrode and the conductor, the pixel electrode overlapping the conductor;
wherein the insulating film comprises a thin section and a non-thin section which is thicker than the thin section;
wherein the pixel electrode includes (a) a part overlapping the thin section and the conductor, and (b) a part overlapping the non-thin section and the conductor;
wherein (i) the thin section includes a part of a gate insulating film and a part of a channel protection film that contact with each other, and (ii) the non-thin section includes another part of said gate insulating film and another part of said channel protection film that contact with each other, and (iii) said gate insulating film covers a gate electrode of the transistor, and (iv) said channel protection film covers a channel of the transistor, and wherein said gate insulating film that is present in both the non-thin section and the thin section is also provided in the transistor between at least the gate electrode and a drain electrode of the transistor; and
wherein the pixel electrode is electrically connected with a drain electrode of the transistor.

4. An active matrix substrate comprising:
a transistor;
a pixel electrode electrically connected to the transistor;
a conductor provided in a layer below the pixel electrode and an insulating film interposed between at least the pixel electrode and the conductor, the pixel electrode overlapping the conductor;
wherein the insulating film comprises a thin section and a non-thin section which is thicker than the thin section;
wherein the pixel electrode includes (a) a part overlapping the thin section and the conductor, and (b) a part overlapping the non-thin section and the conductor;
wherein (i) the thin section includes a part of a gate insulating film and a part of a channel protection film that contact with each other, and (ii) the non-thin section includes another part of said gate insulating film and another part of said channel protection film that contact with each other, and (iii) said gate insulating film covers a gate electrode of the transistor, and (iv) said channel protection film covers a channel of the transistor, and wherein said gate insulating film that is present in both the non-thin section and the thin section is also provided in the transistor between at least the gate electrode and a drain electrode of the transistor; and
wherein the conductor is part of a storage capacity wiring.

5. An active matrix substrate comprising:
a transistor;
a pixel electrode electrically connected to the transistor;
a conductor provided in a layer below the pixel electrode and an insulating film interposed between at least the pixel electrode and the conductor, the pixel electrode overlapping the conductor;
wherein the insulating film comprises a thin section and a non-thin section which is thicker than the thin section;
wherein the pixel electrode includes (a) a part overlapping the thin section and the conductor, and (b) a part overlapping the non-thin section and the conductor;
wherein (i) the thin section includes a part of a gate insulating film and a part of a channel protection film that contact with each other, and (ii) the non-thin section includes another part of said gate insulating film and another part of said channel protection film that contact with each other, and (iii) said gate insulating film covers a gate electrode of the transistor, and (iv) said channel protection film covers a channel of the transistor, and wherein said gate insulating film that is present in both the non-thin section and the thin section is also provided in the transistor between at least the gate electrode and a drain electrode of the transistor; and
wherein a flattening film is provided at the non-thin section, the flattening film being ablated at the thin section.

6. An active matrix substrate comprising:
a transistor;
a pixel electrode electrically connected to the transistor;
a conductor provided in a layer below the pixel electrode and an insulating film interposed between at least the pixel electrode and the conductor, the pixel electrode overlapping the conductor;
wherein the insulating film comprises a thin section and a non-thin section which is thicker than the thin section;
wherein the pixel electrode includes (a) a part overlapping the thin section and the conductor, and (b) a part overlapping the non-thin section and the conductor;
wherein (i) the thin section includes a part of a gate insulating film and a part of a channel protection film that contact with each other, and (ii) the non-thin section includes another part of said gate insulating film and another part of said channel protection film that contact with each other, and (iii) said gate insulating film covers a gate electrode of the transistor, and (iv) said channel protection film covers a channel of the transistor, and wherein said gate insulating film that is present in both the non-thin section and the thin section is also provided in the transistor between at least the gate electrode and a drain electrode of the transistor; and
wherein SOG (spin on glass) film comprising SOG material is included at the non-thin section, the SOG film is ablated at the thin section.

7. The active matrix substrate as defined in claim 4, wherein the storage capacity wiring overlaps a round edge of the pixel electrode.

8. The active matrix substrate as defined in claim 4, wherein the pixel electrode comprises (a) an edge extending along a data signal line connected to a source electrode of the transistor, and (b) an edge facing that edge, and wherein the storage capacity wiring overlaps both of these edges.

9. A display apparatus comprising the active matrix substrate as defined in claim 1.

10. A television receiving comprising the display apparatus of claim 9; and a tuner section receiving television broadcast.

11. An active matrix substrate comprising:
a transistor;
a first pixel electrode electrically connected to the transistor;
a first conductor provided in a layer below the first pixel electrode and an insulating film interposed between at least the first pixel electrode and the first conductor, the first pixel electrode overlapping the first conductor;
a second pixel electrode;
a second conductor provided in a layer below the second pixel electrode and an insulating film interposed between at least the second pixel electrode and the second conductor, the second pixel electrode overlapping the second conductor;
wherein the first and second pixel electrodes are provided so as to correspond to a pixel;

wherein the insulating film comprises a thin section and a non-thin section which is thicker than the thin section;

wherein the first pixel electrode includes (a) a part overlapping the thin section and the first conductor, and (b) a part overlapping the non-thin section and the first conductor; and wherein (i) the thin section includes a part of a gate insulating film and a part of a channel protection film that contact with each other, and (ii) the non-thin section includes another part of said gate insulating film and another part of said channel protection film that contact with each other, and (iii) said gate insulating film covers a gate electrode of the transistor, and (iv) said channel protection film covers a channel of the transistor, and wherein said gate insulating film that is present in both the non-thin section and the thin section is also provided in the transistor between at least the gate electrode and a drain electrode of the transistor.

12. A display apparatus comprising the active matrix substrate as defined in claim 11, wherein said pixel includes a first area corresponding to the first pixel electrode and a second area corresponding to the second pixel electrode; and halftone display is performed by setting a brightness of the first area and a brightness of the second area to different values.

13. The display apparatus of claim 12, wherein the second pixel electrode is connected to another transistor electrically; and the first and second conductors are parts of first and second storage capacity wirings respectively, and are able to individually control electric potentials of the first and second storage capacity wirings, and electric potentials of the first and second pixel electrodes are individually controlled by this potential control.

14. The display apparatus of claim 13, wherein, the electric potential of the first storage capacity wiring is controlled in such a way that the electric potential increases after each of the transistors is turned off and an increased state continues until each of the transistors is turned off in a next frame, and the electric potential of the second storage capacity wiring is controlled in such a way that the electric potential decreases after each of the transistors is turned off and a decreased state continues until each of the transistors is turned off in a next frame, or the electric potential of the first storage capacity wiring is controlled in such a way that the electric potential decreases after each of the transistors is turned off and a decreased state continues until each of the transistors is turned off in a next frame, and the electric potential of the second storage capacity wiring is controlled in such a way that the electric potential increases after each of the transistors is turned off and an increased state continues until each of the transistors is turned off in a next frame.

15. The display apparatus as defined in claim 14, wherein, an increase in the electric potential of the first storage capacity wiring occurs one horizontal period before or after a decrease in the electric potential of the second storage capacity wiring, or a decrease in the electric potential of the first storage capacity wiring occurs one horizontal period before or after an increase in the electric potential of the second storage capacity wiring.

* * * * *